United States Patent
Ni

(10) Patent No.: US 9,496,312 B2
(45) Date of Patent: Nov. 15, 2016

(54) ACTIVE PIXEL STRUCTURE WITH IMPROVED CHARGE TRANSFER

(71) Applicant: NEW IMAGING TECHNOLOGIES, Verrieres le Buisson (FR)

(72) Inventor: Yang Ni, Palaiseau (FR)

(73) Assignee: NEW IMAGING TECHNOLOGIES, Verrieres le Buisson (FR)

( * ) Notice: Subject to any disclaimer, the term of this patent is extended or adjusted under 35 U.S.C. 154(b) by 0 days.

(21) Appl. No.: 14/377,170

(22) PCT Filed: Feb. 13, 2013

(86) PCT No.: PCT/EP2013/052859
§ 371 (c)(1),
(2) Date: Aug. 6, 2014

(87) PCT Pub. No.: WO2013/120890
PCT Pub. Date: Aug. 22, 2013

(65) Prior Publication Data
US 2015/0008493 A1    Jan. 8, 2015

(30) Foreign Application Priority Data

Feb. 15, 2012    (FR) .................................. 12 51387

(51) Int. Cl.
*H01L 31/062*    (2012.01)
*H01L 27/146*    (2006.01)

(52) U.S. Cl.
CPC ... *H01L 27/14689* (2013.01); *H01L 27/14612* (2013.01); *H01L 27/14616* (2013.01); *H01L 27/14643* (2013.01); *H01L 27/1463* (2013.01)

(58) Field of Classification Search
CPC .................. H01L 27/14689; H01L 27/14612; H01L 27/14643; H01L 27/14616; H01L 27/1463
See application file for complete search history.

(56) References Cited

U.S. PATENT DOCUMENTS 4,779,124 A    10/1988    Hynecek
5,077,592 A    12/1991    Janesick
(Continued)

FOREIGN PATENT DOCUMENTS

EP    1 223 623 A2    7/2002
EP    1 732 134 A1    12/2006
EP    1 748 489 A2    1/2007

OTHER PUBLICATIONS

Krymski, A., et al., "Estimates for Scaling of Pinned Photodiodes," *2005 IEEE Workshop on Charge-Coupled Devices and Advanced Image Sensors*, 2005, pp. 60-63.
(Continued)

*Primary Examiner* — Trung Q Dang
*Assistant Examiner* — Wasiul Haider
(74) *Attorney, Agent, or Firm* — Blakely Sokoloff Taylor & Zafman LLP

(57) ABSTRACT

The invention relates to an active CMOS pixel structure comprising: at least one photoelectric conversion zone (NPD) defined by n-doping of the substrate, said zone accumulating an amount of charge during an exposure to light and comprising a p-doped surface zone (PIN); and at least one MOS transfer transistor (TX), the gate of said transfer transistor (TX) being electrically insulated from the substrate and being used to control transfer of said charge from said photoelectric conversion zone (NPD) to said floating diffusion node (FD), in which the gate of said transfer transistor (TX) partially covers said p-doped surface zone (PIN), and said photoelectric conversion zone (NPD) extends under said gate of said transfer transistor (TX) at least as far as the end of the p-doped surface zone (PIN).

20 Claims, 15 Drawing Sheets

(56) References Cited

U.S. PATENT DOCUMENTS

| | | |
|---|---|---|
| 5,880,495 A | 3/1999 | Chen |
| 5,903,021 A | 5/1999 | Lee et al. |
| 5,904,493 A | 5/1999 | Lee et al. |
| 6,100,551 A | 8/2000 | Lee et al. |
| 6,221,686 B1 | 4/2001 | Drowley et al. |
| 6,690,423 B1 | 2/2004 | Nakamura et al. |
| 6,900,484 B2 | 5/2005 | Rhodes |
| 6,979,587 B2 | 12/2005 | Lee |
| 7,378,696 B2 | 5/2008 | Rhodes |
| 7,388,241 B2 | 6/2008 | Rhodes |
| 7,432,543 B2 | 10/2008 | Rhodes |
| 7,618,839 B2 | 11/2009 | Rhodes |
| 7,898,101 B1 | 3/2011 | Huber |
| 2002/0125511 A1* | 9/2002 | Shimotsusa ......... B41J 2/14072 257/288 |
| 2003/0016296 A1 | 1/2003 | Watanabe |
| 2003/0098454 A1 | 5/2003 | Maeda et al. |
| 2005/0001248 A1 | 1/2005 | Rhodes |
| 2005/0230720 A1 | 10/2005 | Miyagawa et al. |
| 2008/0296630 A1* | 12/2008 | Hynecek ........... H01L 27/14609 257/239 |
| 2009/0200588 A1* | 8/2009 | Manabe ............ H01L 27/14603 257/292 |
| 2009/0294816 A1* | 12/2009 | Park .................. H01L 27/14603 257/292 |
| 2010/0149397 A1 | 6/2010 | Mutoh |
| 2010/0237390 A1* | 9/2010 | Kenichi ........... H01L 27/14609 257/226 |
| 2010/0308213 A1 | 12/2010 | Romero et al. |
| 2011/0084316 A1 | 4/2011 | Yamashita et al. |
| 2012/0161270 A1* | 6/2012 | Maehara ................ B82Y 10/00 257/432 |

OTHER PUBLICATIONS

Gao, R., et al., "CMOS Pixels with Storage of Multiple Charges: ISIS," *Deutsches Elektromen-Synchrotron (DESY) Physics Research Committee (PRC) Report*, Nov. 2009, pp. 1-18.

* cited by examiner

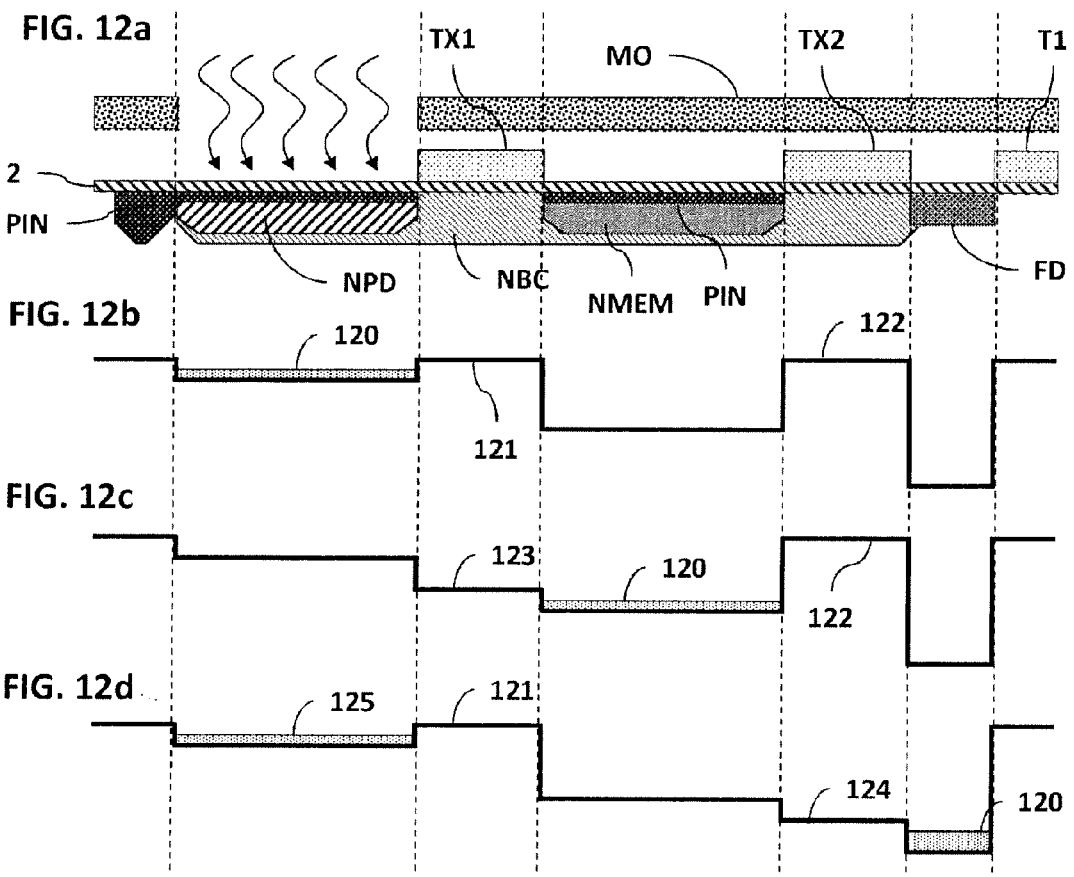
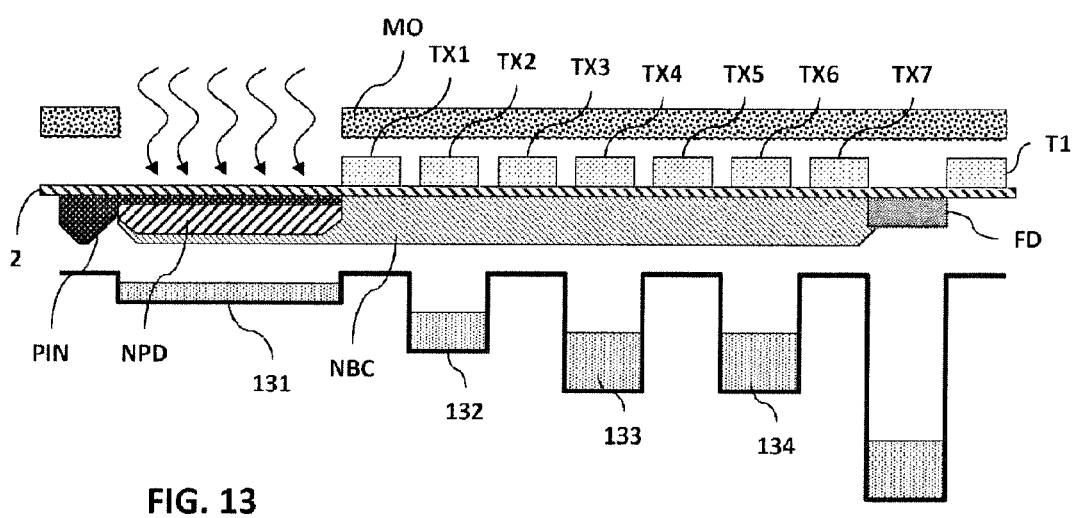
FIG. 13

ACTIVE PIXEL STRUCTURE WITH IMPROVED CHARGE TRANSFER

GENERAL TECHNICAL FIELD AND BACKGROUND OF THE INVENTION

The invention concerns CMOS integration technology (Complementary Metal Oxide Semiconductor) using a family of electronic components with low electric consumption. The invention particularly concerns CMOS pixel structures and image sensor arrays incorporating the same.

CMOS integration technology allows the production of chips for monolithic cameras having good resolution and reasonable image quality. The application of these techniques also allows the obtaining of sensors with low energy consumption. Such sensors also offer fast reading speed on account of the very good operating dynamics of CMOS pixels through the rapid switching of CMOS transistors. In addition, these technologies offer the possibility of integrating packaging, processing, coding and communication functions.

FIG. 1 illustrates the structure of a pixel of an active pixel sensor (APS) having three transistors. Said pixel comprises:
a P-type semiconductor substrate 1;
a photoelectric conversion zone NPD defined by N-doping in the substrate 1 and accumulating an amount of charge during exposure to light, the PN junction formed by the photoelectric conversion zone NPD and the substrate 1 forming a photodiode;
an insulating layer 2 of silicon dioxide on the surface of the substrate 1;
a readout circuit to read a voltage variation induced by charge accumulation, said readout circuit comprising:
a reset transistor T1 controlled by a reset signal RST on its gate for pre-charge resetting of the voltage of the photodiode, said reset transistor T1 having an electrode connected to the photoelectric conversion zone NPD and another electrode connected to the voltage supply VDD;
a readout transistor T2 whose gate is connected to the photoelectric conversion zone NPD whilst one of its electrodes is connected to the voltage supply VDD;
a select transistor T3 controlled by a selection signal SEL which can be applied to its gate, one of its electrodes being common with the other electrode of the readout transistor T2 and the other being connected to a readout line COL.

The photoelectric charge is therefore self-integrated on the junction capacitance of the photodiode after the pre-charge action of the reset transistor T1, and is then read via switching of the select transistor T3. The readout sequence is illustrated in FIG. 2 which gives an operating chronogram of the three-transistor active CMOS pixel shown in FIG. 1.

In this chronogram are schematically illustrated in arbitrary value as a function of time: the course 21 of the reset signal RST, the course 22 of the select signal SEL, the course 23 of voltage VNPD at the photoelectric conversion zone NPD and the course 24 of voltage VCOL on the readout line COL.

At time $t_1$, the photodiode is reset, before imaging, at an initial voltage by means of a reset signal RST activating the reset transistor T1. At time $t_2$ the reset transistor T1 is de-activated by the RST signal and an initial readout then allows determination of said initial voltage to cancel the shift of a voltage follower in the readout circuit. At time $t_3$ the select transistor T3 is deactivated by means of the select signal SEL to allow the photodiode to develop under illumination during exposure. Finally, at time $t_4$ the final readout is performed at the end of exposure by means of a select signal SEL to collect the voltage representing illumination. The final output signal is the difference between the final readout and the initial readout.

However the charge-voltage conversion factor is low on account of the strong value of the junction capacitor forming the photodiode. In addition, during reset readout after time $t_3$, there occurs a switching noise KTC perturbing proper readout of the initial voltage and which cannot be compensated. This structure additionally has a strong dark current in the photodiode on account of surface contact between the silicon of the substrate 1 and the layer of silicon dioxide 2.

One solution to these problems is to transfer the photoelectric charge accumulated in the photodiode onto a small capacitor for charge-voltage conversion. In this case a large photodiode allows the collecting of more photoelectric charge and a small conversion capacitor allows a signal with more ample voltage. For example one electron generates a voltage of 16 µV on a capacitor of 10 fF, but on a capacitor of 1 fF it will generate 160 µV. A strong conversion factor allows system noise to be overcome more easily and improves the detection limit of a pixel.

This solution is implanted in a so-called four-transistor active pixel structure as shown in FIG. 3. The readout circuit is similar to that of the three-transistor active pixel previously described with the difference that here it is connected to a node called a floating diffusion node FD. This floating diffusion node FD is defined by N-doping in the substrate 1. This floating diffusion node FD is therefore a small capacitor formed of a small-sized PN junction. The low capacitance value of the floating diffusion node FD causes a large variation in voltage when an electric charge is transferred thereto.

The pixel also comprises a photoelectric conversion zone NPD defined by N-doping in the substrate 1 and accumulating a photoelectric charge during exposure to light. Here it comprises a P-doped surface zone PIN to isolate the photoelectric conversion zone NPD from the isolating layer 2 of silicon dioxide. This heavily P-doped surface zone PIN on the upper surface of the photoelectric conversion zone NPD, connected to the substrate 1 (here acting as ground) suppresses the strong dark current generated on the surface of the silicon substrate 1. This photodiode structure is called a <<pinned photodiode>> (PPD) since the surface potential is pinned at a fixed potential.

A transfer transistor TX transfers the photoelectric charge of the photoelectric conversion zone NPD towards the floating diffusion node FD. For this purpose, the N-doping of said floating diffusion node FD is heavier than the N-doping of the photoelectric conversion zone NPD. In general, the transfer transistor TX is formed by a MOS transistor with surface channel where the heavily P-doped surface zone PIN and the photoelectric conversion zone NPD are aligned with one of the edges of the gate TX.

When the gate of the transfer transistor TX is biased with a low potential, an electric barrier is formed between the floating diffusion node FD and the photoelectric conversion zone NPD. The photoelectric conversion zone NPD is then in an integration state. The electric potential of the photoelectric conversion zone NPD of the photodiode PPD must also fully deplete the latter of free electrons so that only pinned positive charges remain in the photoelectric conversion zone NPD at the start of exposure.

When the gate of the transfer transistor TX is biased with a high potential, this electric barrier is lowered, then allowing the photoelectric charge to pass from the photoelectric conversion zone NPD towards the floating diffusion node FD. The variation in voltage on the floating diffusion node FD generates a voltage signal proportional to the amount of charge received.

The variation in voltage is measured by the readout circuits composed of a voltage follower within the pixel and differential amplifiers on the periphery of the pixel array. Voltage variation measurement is based on two correlated readouts therefore allowing suppression of reset noise.

FIG. 4 is a chronogram of the four-transistor active pixel. This chronogram schematically illustrates in arbitrary units as a function of time: the course 41 of the reset signal RST, the course 42 of the signal applied to the gate of the transfer transistor TX, the course 43 of the select signal SEL, the course 44 of voltage VFD at the floating diffusion node FD and the course 45 of voltage VCOL on the readout line COL. At time $t_1$ the floating diffusion node FD is reset, before image-taking, at an initial voltage by means of the RST signal activating the reset transistor T1, and the select transistor T3 becomes conductive by means of the select signal SEL.

At time $t_2$ the reset transistor T1 is deactivated and initial readout allows determination of said initial voltage. At time $t_3$ the transfer transistor TX is made conductive to transfer the charges from the photoelectric conversion zone NPD towards the floating diffusion node FD. At time $t_4$ the transfer transistor TX is deactivated whilst a second readout takes place on the readout line. At time $t_5$ the select transistor T3 is deactivated.

The output signal is the difference between the initial readout and the second readout, and is formed by the variation in voltage caused by the photoelectric charge accumulated in the photoelectric conversion zone NPD which has been transferred to the floating diffusion node FD. The reset noise of the floating node FD is therefore naturally compensated by the differential readout circuit.

In prior art embodiments, it is typically sought to obtain the best possible alignment between the heavily P-doped surface zone PIN, the photoelectric conversion zone NPD and the edge of the gate of the transfer transistor TX. The heavily P-doped surface zone PIN must effectively insulate the photoelectric conversion zone NPD from the silicon surface 2 since any contact between the photoelectric conversion zone NPD and an exposed part of the silicon surface 2 would generate a strong dark current.

It is then typically sought to ensure that this alignment forms neither a barrier nor an energy pocket for charge transfer. A parasitic barrier prevents complete transfer of charges from the photoelectric conversion zone NPD towards the floating diffusion node FD. Incomplete charge transfer creates readout noise and pixel afterglow. An energy pocket may retain part of the charges during transfer and will cause the same problems of noise and pixel afterglow.

FIGS. 5*a*, 5*b* and 5*c* show an example of the consequence of misalignment in the PPD photodiode and gate of the transfer transistor TX wherein the photoelectric conversion zone NPD does not extend as far as the gate of the transfer transistor TX.

FIG. 5*a* shows a cross-section of the pixel structure in FIG. 3, and FIGS. 5*b* and 5*c* schematically illustrate the energy levels of the electrons in the corresponding regions when the gate of the transfer transistor TX is biased with a low potential and a high potential respectively.

When the gate of the transfer transistor TX is biased with a low potential (FIG. 5*b*) the corresponding energy level 51 of the electrons is high containing the charge in the photoelectric conversion zone NPD.

When the gate of the transfer transistor TX is biased with a high potential (FIG. 5*c*) it can be seen that, since the photoelectric conversion zone does not extend as far as the gate of the transfer transistor TX, an electric barrier 53 at missing part 54 of the photoelectric conversion zone NPD prevents the transfer of charges 55 from the photoelectric conversion zone NPD towards the low energy level 52 created by applying a high potential to the transfer transistor TX, and hence towards the floating diffusion node FD.

FIGS. 6*a*, 6*b* and 6*c* give an example of the consequences of misalignment in the photodiode PPD and gate of the transfer transistor TX wherein the heavily P-doped surface zone PIN does not extend as far as the gate of the transfer transistor TX and therefore leaves part 64 of the photoelectric conversion zone in contact with the insulating layer 2, setting up a large dark current.

FIG. 6*a* is a cross-section of the pixel structure in FIG. 3, and FIGS. 6*b* and 6*c* schematically illustrate the energy levels of the electrons in the corresponding regions when the gate of the transfer transistor TX is biased with a low potential and a high potential respectively.

When the gate of the transfer transistor TX is biased with a low potential (FIG. 6*b*) the corresponding electron energy level 61 is high, containing the charge in the photoelectric conversion zone NPD.

When the gate of the transfer transistor TX is biased with a high potential (FIG. 6*c*) it can be seen that the part 64 of the photoelectric conversion zone in contact with the insulating layer 2 results in the onset of an energy pocket 63 wherein the electron energy level is lower than the energy level 62 corresponding to the application of a high potential to the gate of the transistor TX.

The transfer of charges 65 accumulated in the photoelectric conversion zone NPD is therefore only partial. If one part 66 of the charge is indeed transferred towards the floating diffusion node FD, another part 67 of the charge remains trapped at the energy well 67.

In addition, in this structure of a four-transistor pixel the coupling between the photoelectric conversion zone NPD and the gate of the transfer transistor TX forms another difficulty. A photodiode PPD is a buried device wherein the charge is stored in the bulk of the silicon. The gate of the transfer transistor TX is a surface device wherein the charge transfer channel 80, transferring charges in the accumulation region 81 of the photoelectric conversion zone NPD from the latter towards the floating diffusion node FD, is located on the surface of the silicon as illustrated in FIG. 7. The arrow in FIG. 7 shows the charge transfer pathway under the gate of the transfer transistor TX. Much engineering endeavour is required to ensure the transition between the buried accumulation region 81 in the photoelectric conversion zone NPD and the surface transfer channel 80 underneath the gate TX.

The fact that the transfer transistor TX acts as surface device raises a possible problem of dark current for the photodiode PPD. The generation of electron-hole pairs under the gate of the transfer transistor TX may propagate within the photodiode PPD contaminating the latter. Great care must be given to all fabrication steps.

This structure with photodiode PPD and charge transfer transistor TX is similar to the structure of a virtual phase Charge Coupled Device CCD disclosed in U.S. Pat. No. 4,779,124. These problems are analysed in U.S. Pat. No. 5,077,592 and an improved so-called OPP structure (Open Pinned Phase) is proposed.

U.S. Pat. No. 6,221,686 proposes forming the basic structure of a four-transistor active pixel in a standard CMOS structure. U.S. Pat. No. 6,979,587 provides an improvement in the positioning of the photoelectric conversion zone NPD in relation to the isolating islands STI.

U.S. Pat. No. 5,880,495 and U.S. Pat. No. 5,903,021 improve on the transition between the photoelectric conversion zone PPD and the gate of the transfer transistor TX by adding N-type diffusion around the boundaries between the photoelectric conversion zone PPD and the gate of the transfer transistor TX.

U.S. Pat. No. 6,100,551 proposes diffusion underneath the gate of the transfer transistor TX. This diffusion allows the formation of a buried channel. However the structure remains vulnerable to misalignment of masks during fabrication of the pixel structure.

U.S. Pat. No. 6,900,484, U.S. Pat. No. 7,378,696, U.S. Pat. No. 7,388,241, U.S. Pat. No. 7,432,543 and U.S. Pat. No. 7,618,839 propose the creation of a highly sophisticated doping profile in the bulk of the substrate silicon for the photoelectric conversion zone NPD to obtain better transfer of charges from the latter to the diffusion node FD. U.S. Pat. No. 7,898,101 proposes replacing the highly doped surface layer PIN by a biased transparent electrode to bypass the aligning constraint between the highly doped surface layer PIN, the photoelectric conversion zone NPD and the gate of the transfer transistor TX.

The fabrication of a four-transistor active CMOS pixel therefore remains highly complex and costly despite it conceptual simplicity. Very few CMOS foundries can master these techniques.

It follows in particular from the foregoing that persons skilled in the art have always sought to align the gate of the transfer transistor TX with the doped regions forming the photodiode PPD. This alignment is generally obtained by forming said gate of the transfer transistor TX before implanting the doped regions forming the photodiode PPD, the gate of the transfer transistor TX then acting as mask for the implanting of the doped regions forming the photodiode PPD.

In CMOS technology fabrication processes, miniaturisation of the transistors is of importance. One major difficulty encountered is the diffusion of dopants during fabrication. For good dopant activation after ion implantation, ultra-short heat treatments at high temperature (Rapid Thermal Annealing—RTA) are used for the purpose of obtaining maximum limitation of dopant diffusion. RTA can obtain efficient activation of dopants and limit the diffusion thereof since the diffusion rate of dopants is scarcely temperature-dependent.

However this type of fabrication is not optimal for image sensors in which good quality PN junctions are needed for the photodiode. Therefore in the first embodiment presented below the photodiode junctions can only be formed using the same heat treatment as for the CMOS transistors.

DISCLOSURE OF THE INVENTION

To better overcome the aforementioned shortcomings, an active pixel structure is proposed of CMOS type comprising:
a P-type semiconductor substrate;
at least one photoelectric conversion zone defined by N-doping in the substrate, accumulating an amount of charge during exposure to light and comprising a P-doped surface zone;
at least one floating diffusion node defined by N-doping in the substrate;
at least one readout circuit to read a variation in voltage on the floating diffusion node induced by the transferred charges;
at least one transfer transistor of MOS type, the gate of said transfer transistor being electrically insulated from the substrate and being controllable to transfer said charges from said photoelectric conversion zone towards said floating diffusion node;
wherein the gate of said transfer transistor partly covers said P-doped surface zone, and said photoelectric conversion zone extends underneath said gate of said transfer transistor at least as far as the end of the P-doped surface zone covered by said transfer transistor gate.

In this manner, it is no longer necessary to obtain precise alignment between the gate of the transfer transistor and the photodiode. The gate of the transfer transistor can be deposited after forming the photodiode, and it is therefore possible to apply heat treatment to the photodiode that is specifically adapted to the needs of the photodiode before forming the transistors, including the transfer transistor, without deteriorating the transistor-dedicated heat budget.

It is therefore possible to apply different heat treatments for the photodiodes and transistors since their respective heat treatments correspond to different heat budgets. It is hence possible to choose the application of heat treatment for the photodiode which would not be possible in the presence of the transistors. For example, heat treatment can be applied to soften the doping profile of the photodiode constituents and/or activation heat treatment for the photodiode whose heat budget is higher than can be withstood by the CMOS transistors.

The pixel structure is advantageously completed by the following characteristics taken alone or in any technically possible combination thereof:
the P-doped surface zone can extend under the gate of said transfer transistor as far as the end of said photoelectric conversion zone on the side of said transfer transistor gate;
the P-doped surface zone extending underneath the gate of said transfer transistor can leave free part of the surface of said photoelectric conversion zone on the side of said transfer transistor gate;
the structure comprises a well, defined by N-doping in the substrate; this well is in contact with the floating diffusion node and with the photoelectric conversion zone and covers at least part of the extent of said photoelectric conversion zone to ensure transfer of charges in the volume of the well;
the N-doping of the well or N-doping of the photoelectric conversion zone is lighter than the N-doping of the floating diffusion node, and the N-doping of the well is lighter than the N-doping of the photoelectric conversion zone;
the electric potential profiles of the photoelectric conversion zone and of the well at the transfer transistor have electric potential peaks at the same depth of substrate;
the well covers the entire extent of said photoelectric conversion zone;
the structure further comprises at least one memory region in the well between the photoelectric conversion zone and the floating diffusion node;
an optical mask masks said at least one memory region;
at least one memory region is defined by n-doping in the well with a P-doped surface zone between two transfer transistors;

the N-doping of the memory region is heavier than the N-doping of the photoelectric conversion zone and lighter than the N-doping of the floating diffusion node;

at least one memory region is controlled by a gate of a MOS transistor.

The invention also concerns an image sensor comprising an organised assembly of active pixel structures of CMOS type as previously described.

A fabrication method is also proposed for fabricating an active pixel structure of CMOS type as previously presented, comprising at least the following steps:

a) implanting P-type isolation wells in the substrate;

b) forming a photoelectric conversion zone defined by N-doping in the substrate, and forming a P-doped surface zone at said photoelectric conversion zone;

c) forming the gate of at least one transfer transistor of MOS type partly covering said P-doped surface zone;

d) forming a floating diffusion node defined by N-doping in the substrate, extending as far as the gate of said transfer transistor of MOS type.

The fabrication method is advantageously completed by the following characteristics taken alone or in any technically possible combination thereof:

after step b) the P-doped surface zone extends as far as the end of the photoelectric conversion zone on the side intended to receive the transfer transistor gate;

after step b), the P-doped surface zone (PIN) leaves free part of the surface of said photoelectric conversion zone (NPD) on the side intended to receive the gate of a transfer transistor (TX), and after step e) the gate of said transfer transistor (TX) covers the surface left free of said photoelectric conversion zone (NPD)

after step a) and before step b) a well, defined by N-type doping in the substrate, is implanted so that the floating diffusion node implanted at step d) is in contact with said well;

at step b) the photoelectric conversion zone is at least partly formed in the well, the N-doping to form said photoelectric conversion zone being heavier than the N-doping forming the well;

after step b) and before step c) heat treatment is performed;

after step d) an additional P-doping operation is performed to extend said P-doped surface zone as far as the P-type isolating well implanted in the substrate;

the respective angles of incidence of the implantation directions in the substrate of said P-doped surface zone and said photoelectric conversion zone in relation to the normal to the surface of said substrate differ from one another so that the P-doped surface zone leaves free part of the surface of said photoelectric conversion zone on the side intended to receive the transfer transistor gate;

the respective angles of incidence of the implantation directions in the substrate of the P-doped surface zone and photoelectric conversion zone are of opposite signs in relation to the normal to the surface of said substrate.

PRESENTATION OF THE FIGURES

Other aspects, objectives and advantages of the present invention will become better apparent on reading the following detailed description. The invention will also be better understood with reference to this description to be considered together with the appended drawings given as non-limiting examples and in which:

FIG. 1, already described, is a schematic illustrating the structure of a three-transistor active pixel in the prior art;

FIG. 2, already described, is a chronogram illustrating the signals occurring during functioning of the pixel in FIG. 1;

FIG. 3, already described, is a schematic illustrating the structure of a four-transistor active pixel in the prior art;

FIG. 4, already described, is a chronogram illustrating the signals occurring during functioning of the pixel in FIG. 3;

FIGS. 5a, 5b, 5c, 6a, 6b and 6c, already described, are schematics illustrating the energy level profiles of the electrons in the structure in FIG. 3 during charge transfer when there is poor alignment of the pixel components;

FIG. 7, already described, is a schematic illustrating the surface nature of charge transfer with a structure as in FIG. 3;

FIGS. 11 to 13 are schematics illustrating possible embodiments of the invention;

DETAILED DESCRIPTION

The following description presents a first embodiment of an active pixel structure and a second embodiment. The second embodiment can be carried out independently of the first embodiment, or it may be an improvement thereupon and can therefore incorporate all or part of the technical characteristics.

Figure 1:
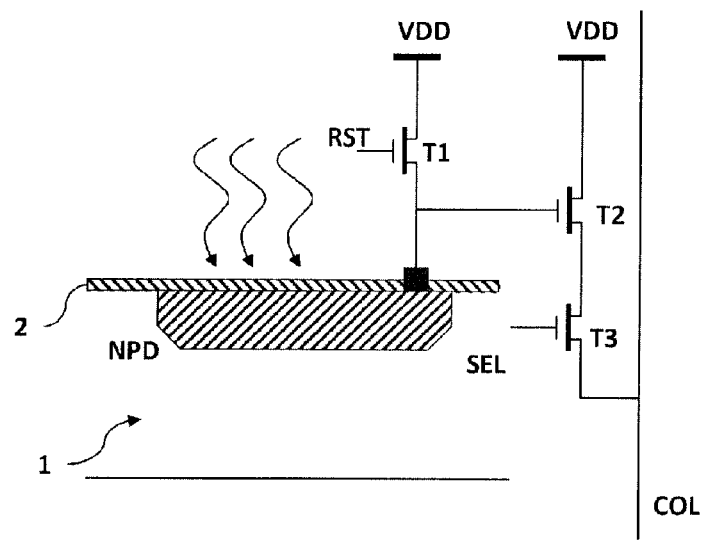
Figure 2:
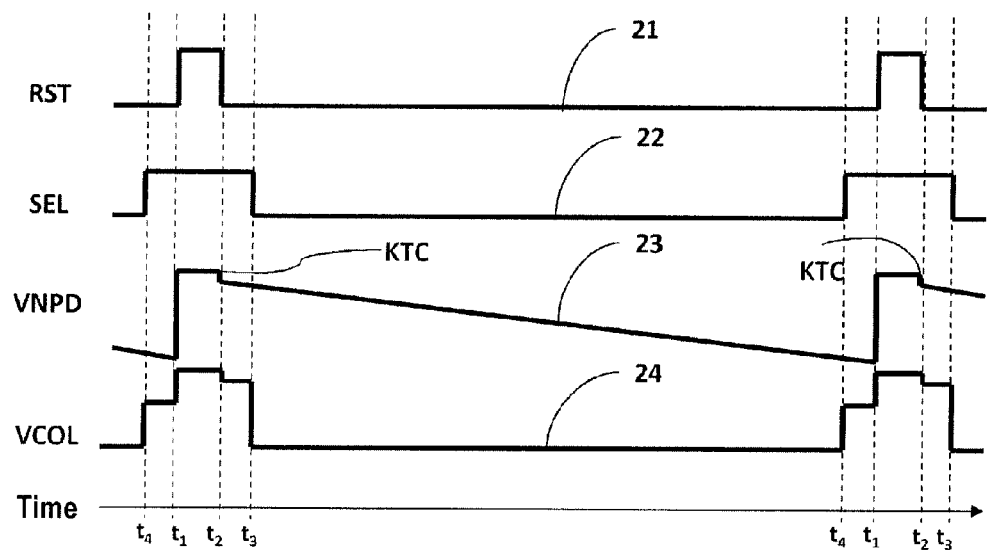
Figure 3:
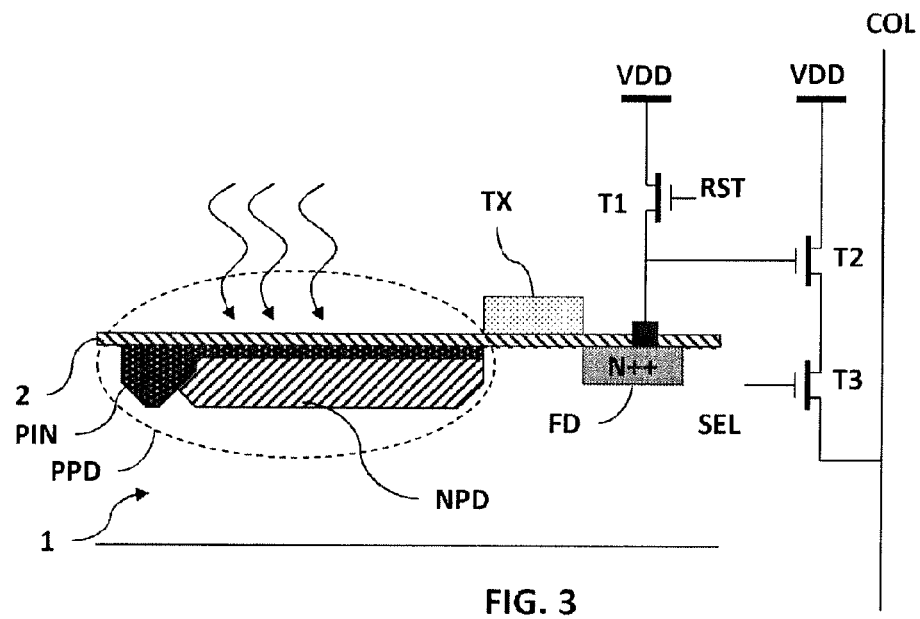
Figure 4:
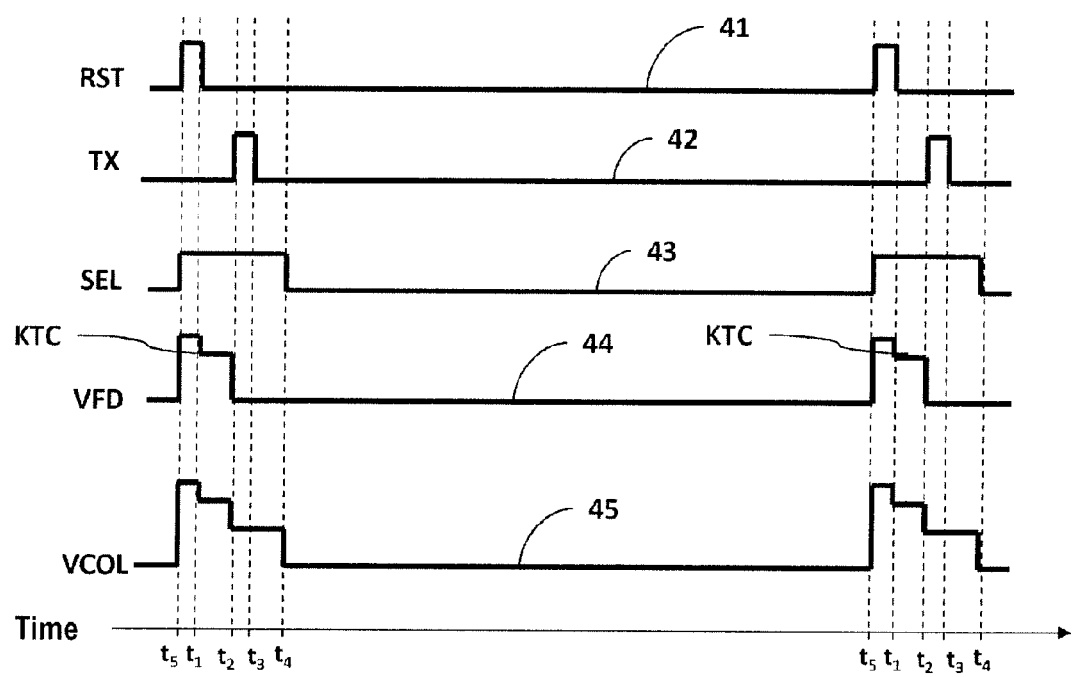
Figure 5A:
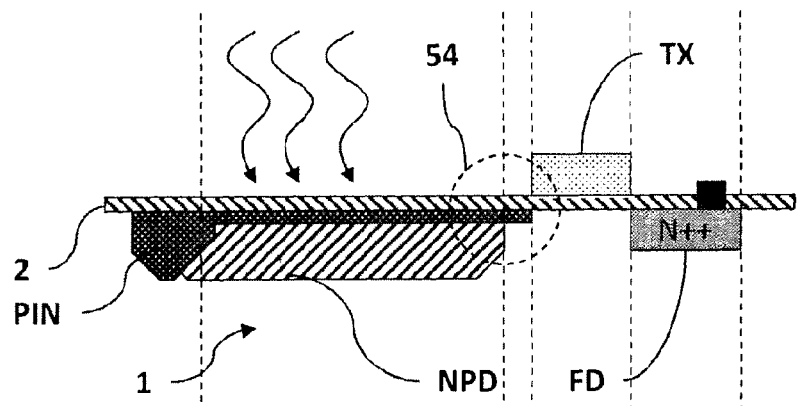
Figure 5B:
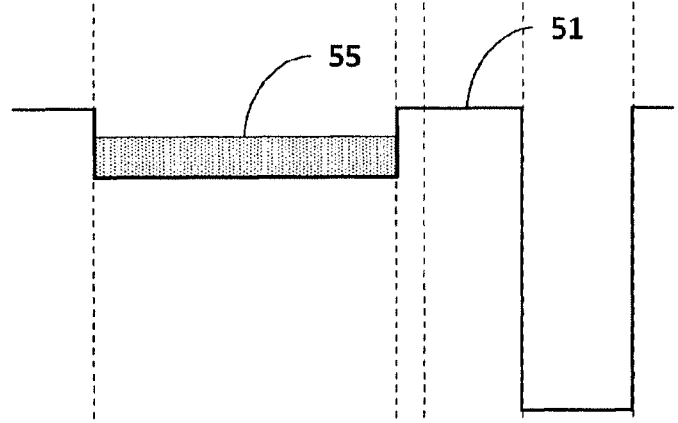
Figure 5C:
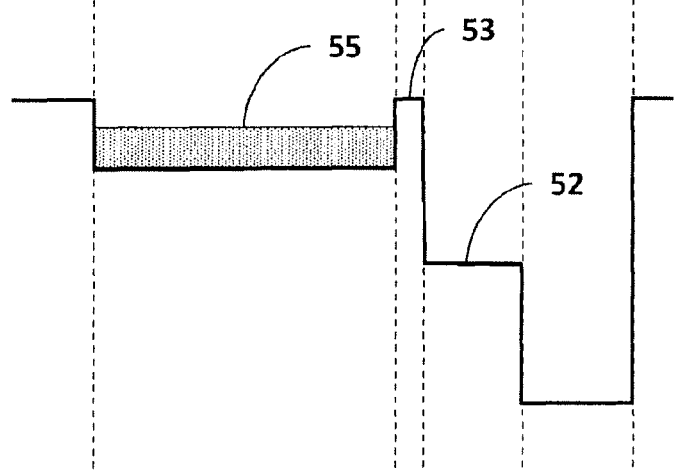
Figures 6A, 6B, 6C:
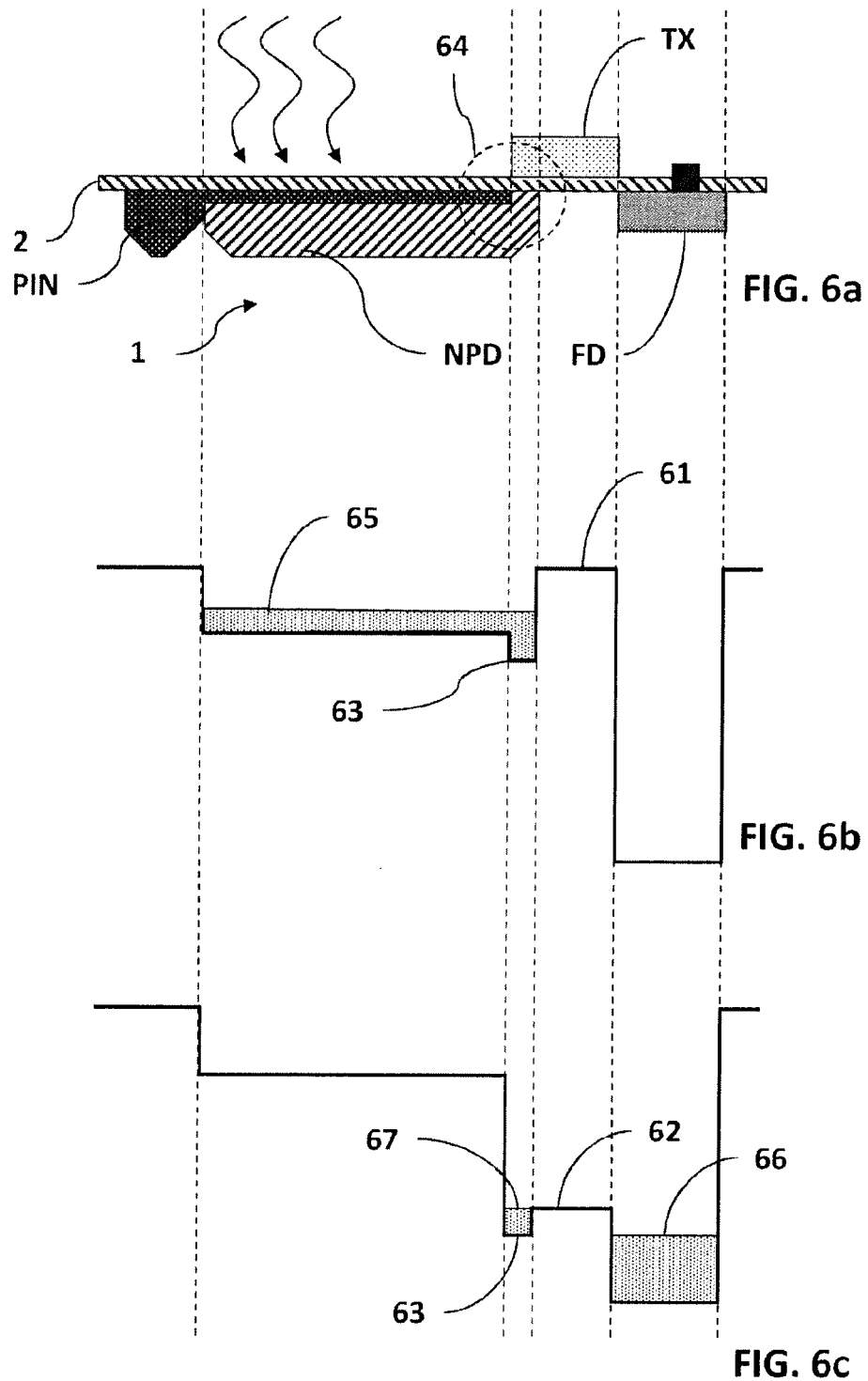
Figure 7:
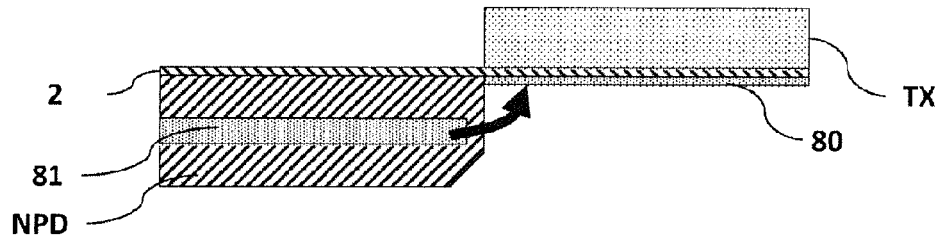
Figure 8:
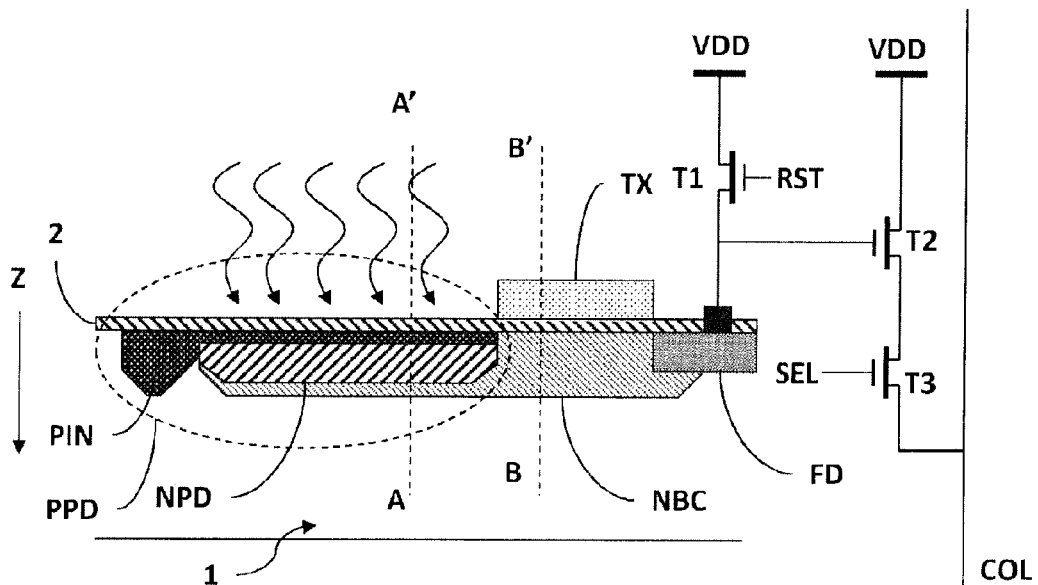
FIG. 8 is a schematic illustrating an active pixel structure according to a first embodiment of the invention.

With reference to FIG. 8, an active pixel structure according to the first embodiment comprises a P-type semiconductor substrate 1 in which at least one photoelectric conversion zone NPD is defined by N-type doping to accumulate an amount of charge during exposure to light. A shallow, heavily P-doped surface zone PIN forms a co-called "pinning" layer for ground pinning of the surface potential of the photoelectric conversion zone NPD.

A floating diffusion node FD defined by N-doping in the substrate 1 is arranged at a distance away from the photoelectric conversion zone NPD. The N-doping of the floating diffusion node FD is generally heavier than the N-doping of the photoelectric conversion zone NPD.

Very often the floating diffusion node FD can be merged with the source of the reset transistor T1.

An isolating layer 2 of silicon dioxide is arranged on the surface of the substrate 1 and in particular insulates the gate of the transfer transistor TX from the substrate 1.

The structure further comprises a transfer transistor TX of MOS type arranged between the floating diffusion node FD and the photoelectric conversion zone NPD, the gate of said transfer transistor TX being electrically insulated from the substrate 1 and being controllable to transfer the charge from the photoelectric conversion zone NPD to the floating diffusion node FD.

The structure additionally comprises a readout circuit to read a variation in voltage on the floating diffusion node FD induced by the transferred charges, said circuit being composed of three transistors and comprising:

a reset transistor T1 controlled by a reset signal RST on the gate thereof to reset the voltage of the floating diffusion node FD by pre-charge, said reset transistor T1 having one electrode connected to the floating diffusion node FD and another electrode connected to the voltage supply VDD;

a readout transistor T2 whose gate is connected to the floating diffusion node FD whilst one of its electrodes is connected to the voltage supply VDD;

a select transistor T3 controlled by a select signal SEL applied to the gate thereof, one of its electrodes being common with the other electrode of the readout transistor T2 and the other being connected to a readout line COL.

Finally the structure of the active pixel comprises a well NBC defined by N-doping in the substrate 1, the N-doping of the well NBC being lighter than the N-doping of the photoelectric conversion zone NPD and lighter than the N-doping of the floating diffusion node FD, the well NBC being in contact with the floating diffusion node FD and with the photoelectric conversion zone NPD and at least partly overlying the extent of the photoelectric conversion zone NPD to ensure transfer of charges in the volume of the well NBC.

Preferably, the well NBC covers the entire extent of the photoelectric conversion zone NPD. First the environment of the photoelectric conversion zone NDP will then be more homogeneous and secondly photoelectric charge transfer will thereby be facilitated.

Therefore preferably and as illustrated in FIG. 8 the well NBC extends so as to encompass the photoelectric conversion zone NPD at least in its section perpendicular to exposure thereof and preferably completely encompasses the photoelectric conversion zone NPD. The well NBC extends as far as the floating diffusion node FD and is in contact therewith but does not necessarily encompass it. The well NBC therefore forms a buried channel by means of which the charge of the photoelectric conversion zone NPD can be transferred to the floating diffusion node FD in the bulk of the silicon, and not on the surface thereof.

Figure 9:
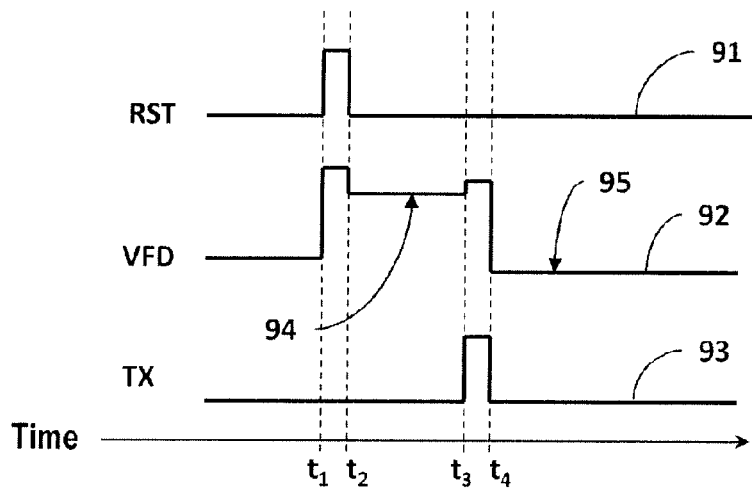
FIG. 9 is a chronogram illustrating the signals occurring during functioning of the pixel in FIG. 8.

FIG. 9 is a chronogram showing the course 91 of the reset signals RST, the course 92 of voltage at the floating diffusion node FD and the course 93 of biasing voltage of the gate of the transfer transistor TX.

At time $t_1$ the floating diffusion node FD is pre-charged at a high potential by activation of the reset transistor T1 via the reset signal RST.

At time $t_2$ the reset transistor T1 is deactivated and a first readout 94 of the voltage VFD of the floating diffusion node FD is carried out.

At time $t_3$ the transfer transistor TX is made conductive to transfer the charge from the photoelectric conversion zone towards the floating diffusion node FD. The photoelectric conversion zone NPD and the well NBC are fully depleted by the imposed biasing during activation of the gate of the transfer transistor TX.

At time $t_4$ the transfer transistor is made non-conductive and a second readout 95 of the voltage VFD of the floating diffusion node FD is performed. The final output signal will be the difference between the second readout and the first readout.

Figure 10:
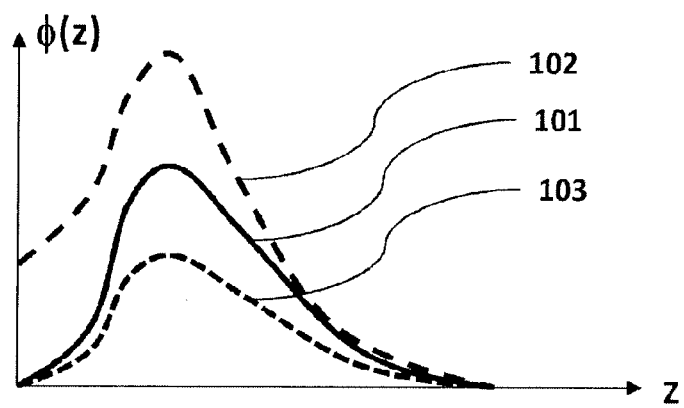
FIG. 10 is a graph showing the electric potential curves of sections of the structure in Figure as a function of substrate depth.

FIG. 10 gives electric potential curves of sections of the structure in FIG. 8 as a function of the depth Z of the substrate. Curve 101 gives the potential profile in the photoelectric conversion zone NPD along the sectional plane AA' in FIG. 8. Curves 102 and 103 give the potential profile at the transfer transistor TX along the sectional plane BB' in FIG. 8 when a high and low biasing voltage is respectively applied to the gate of the transfer transistor TX.

It is preferable that the electric potential profiles of the photoelectric conversion zone NPD and of the well NBC at the transfer transistor TX should exhibit electric potential peaks at the same depth of the substrate. There is therefore no shift between the electron accumulation region in the photoelectric conversion zone NPD and the transfer channel underneath the gate of the transfer transistor TX.

According to this principle the charge storage volume does not come into contact with the isolating layer 2 even in the presence of any misalignment between the photoelectric conversion zone NPD, the surface zone PIN and the gate of the transfer transistor TX.

Charge transfer therefore always occurs within the bulk of the silicon of the substrate 1 without any contact with the silicon surface. This transfer mode provides enormous relaxation of constraints regarding the quality of the silicon-silicon dioxide interface and reduces transfer noise, especially low frequency noise which is most difficult to filter.

Figure 11:
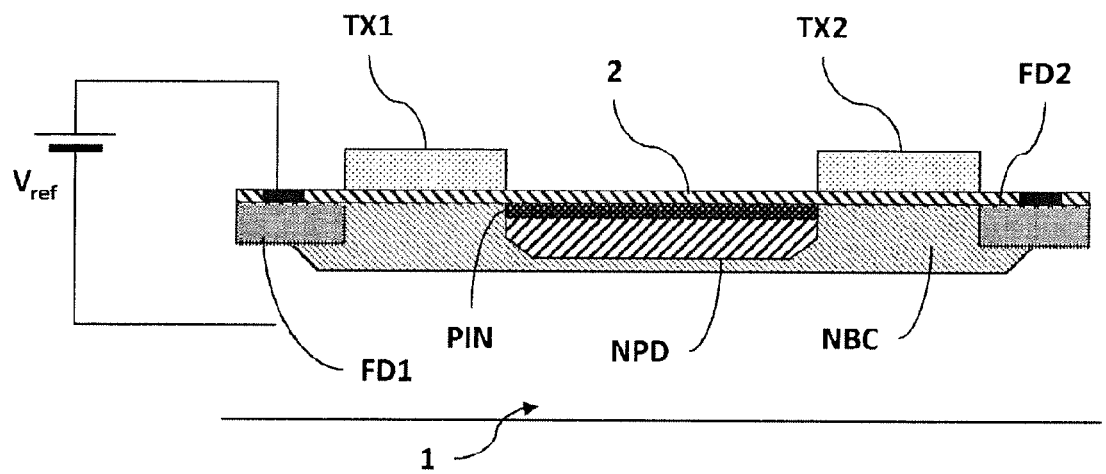

It is sometimes useful to have several transfer transistors TX1 each associated with a floating diffusion node FD. It is therefore possible in particular to apply antiglare and electronic shutter functions. FIG. 11 shows a configuration with two floating diffusion nodes FD1 and FD2 and two transfer transistors TX1 and TX2.

The first floating diffusion node FD1 illustrated on the left in FIG. 11 is directly connected to a biasing source at a reference voltage $V_{ref}$ and the second floating diffusion node FD2 illustrated on the right in FIG. 11 is connected to another reference voltage via a reset transistor, as previously. The variation in voltage of the second floating diffusion node FD2 gives the image signal with the action of the second transfer transistor TX2. The action of the first transfer transistor TX1 transfers the photoelectric charge towards the first floating diffusion node FD1 and the charge is absorbed by the biasing source. This action depletes the charge accumulated at the photoelectric conversion zone and reduces effective exposure time, thereby fulfilling a shutter function.

It is also possible to bias the first transfer transistor TX1 with a potential midway between the high potential and low potential of the second transfer transistor TX2. In this case the transfer channel underneath the first transfer transistor TX1 allows the depleting of excess charge in the photoelectric conversion zone NPD. This configuration prevents excess charge from entering neighbouring pixels thereby avoiding the onset of a glare phenomenon.

The structure of the present invention therefore provides the possibility of obtaining a local memory function within a pixel. This function is most useful either to create a capture mode in which all the pixels are simultaneously exposed to light, or to create high speed image capture when several memory regions are installed in a pixel.

FIG. 12a shows a first possible structure for forming a memory region for the photoelectric charge. Compared with the structure in FIG. 8 this structure further comprises a memory region NMEM defined by N-doping in the well NBC with a P-doped surface zone PIN between two transfer transistors TX1 and TX2.

The gate of the first transfer transistor TX1 is electrically insulated from the well NBC above which it is arranged, between the photoelectric conversion zone NPD and the memory region NMEM. The gate of the second transfer transistor TX2 is electrically insulated from the well NBC above which it is arranged, between the memory region NMEM and the floating diffusion node FD.

The N-doping of the memory region is heavier than the N-doping of the photoelectric conversion zone NPD and lighter than the N-doping of the floating diffusion node FD.

FIGS. 12b, 12c and 12d in arbitrary value schematically illustrate the energy levels of the electrons along the structure in FIG. 12a, in different subsequent biasing configurations of the gates of the first and second transfer transistors TX1 and TX2 and in operating mode of the structure.

FIG. 12b corresponds to a low potential applied to the gate of the first transfer transistor TX1 and to the gate of the second transfer transistor TX2. It can be seen that the first and second transfer transistors TX1 and TX2 each generate an electric barrier 121, 122 so that the charge 120 remains confined at the photoelectric conversion zone NPD.

FIG. 12c corresponds to the following situation in which a high potential is applied to the gate of the first transfer transistor TX1, whilst a low potential is still applied to the gate of the second transfer transistor TX2. The energy level 123 of the electrons in the conduction channel corresponding to the first transistor TX1 has become sufficiently low to allow the charge 120 to be transferred from the photoelectric conversion zone NPD to the memory region NMEM, in particular on account of the heavier N-doping of the memory region NMEM compared with the N-doping of the photoelectric conversion zone NPD. However, the barrier 122 corresponding to the blocked second transfer transistor TX2 remains which means that the charge remains confined in the memory region NMEM.

FIG. 12d corresponds to the following situation in which a low potential is again applied to the gate of the first transfer transistor TX1 whilst a high potential is now applied to the gate of the second transfer transistor TX2. The energy level 124 of the electrons in the conduction channel corresponding to the second transistor TX2 has then become sufficiently low to allow the charge 120 to be transferred from the memory region NMEM to the floating node FD in particular on account of the heavier N-doping of the floating diffusion node FD compared with the N-doping of the memory region NMEM. However, the barrier 121 corresponding to the first transfer transistor TX1 again blocks the charge 125 within the photoelectric conversion zone.

In this manner a local memory function is obtained within a pixel. An optical mask MO masks said at least one memory region and the gates of the transfer transistors TX1 and TX2.

It is possible to create several memory regions in cascade, but the successive incrementing of ion implanting doses makes this structure scarcely viable. This structure is therefore especially useful for forming a pixel in snapshot mode.

It is possible however to form multiple memory regions using several gates on the well NBC. The PIN layer pins the surface potential of the photoelectric conversion zone NPD to zero potential. Therefore the only means of creating potential profiles is by modulating doping since a gate cannot bias the surface potential below zero on account of the surface inversion of the N-doped region.

FIG. 13 shows one embodiment of a pixel structure with multiple memory regions in which the memory regions are controlled by a gate of a MOS transfer transistor TX1 with the corresponding energy levels.

Gates of transfer transistors TX1 are arranged in series between the photoelectric conversion zone NPD and the floating diffusion node FD, and are electrically insulated from the well NBC defined in the substrate 1. Sequential controlling of these gates of the transfer transistors TX1 thereby allows step-by-step transfer of the different photoelectric charges 132, 133, 134 each corresponding to the charge accumulated by the photoelectric conversion zone during sequential exposures, in similar manner to the operation illustrated in FIGS. 12b to 12d.

A transfer structure with multiple gates is thereby inserted in a pixel and coupled with a region of conventional CMOS transistors. This pixel structure allows an image sensor to be obtained with very high video rate by storing the images in each pixel before outputting these images. A rate faster than one million images per second is possible which is most useful for the observing of rapid phenomena.

Image readout on the floating diffusion is the same as for a conventional four-transistor pixel. Persons skilled in the art are able to design adequate circuitry on the basis of publicly available technical knowledge. A research report by R. Gao et al. titled "CMOS Pixels with Storage of Multiple Charges. ISIS" was presented to the meeting of the Deutsches Elektronen-Synchrotron (DESY) Physics Research Committee (PRC) in November 2009. This document describes a conventional three-phase CCD structure using CMOS technology and gives all the details needed to produce said control circuitry.

FIGS. 14a to 14i illustrate different steps of a first method for fabricating an active pixel structure according to the first embodiment.

Figure 14A:
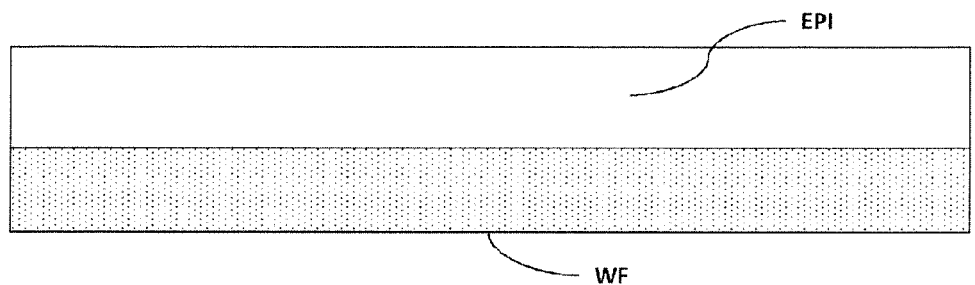
FIGS. 14a to 14i illustrate different steps of a first method of fabricating an active pixel structure.

Starting from an initial situation corresponding to FIG. 14a in which a P-type silicon wafer WF carries a P-type epitaxied layer EPI, said epitaxied layer EPI having a thickness of between 3 and 10 µm for example in relation to pixel size and desired spectral response. The electric resistivity of the wafer WF is lower than that of the epitaxied layer EPI. For example the electric resistivity of the wafer WF is 0.01 Ω·cm whilst that of the epitaxied layer EPI is between 8 and 20 Ω·cm.

Figure 14B:
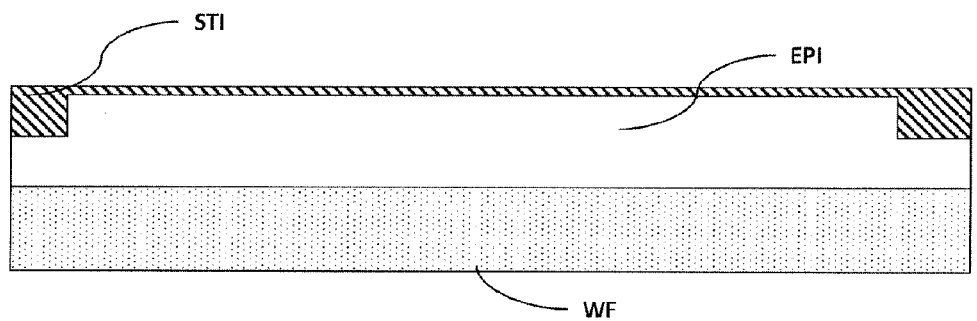

Isolating islands are then formed in the form of lateral isolating structures via shallow trenches (Shallow Trench Isolation STI) conforming to a standard CMOS method as illustrated in FIG. 14b. This isolation is also used for electric insulation of the components arranged on the surface of the substrate vis-à-vis this substrate and in particular the gate(s) of the transfer transistors TX.

Figure 14C:
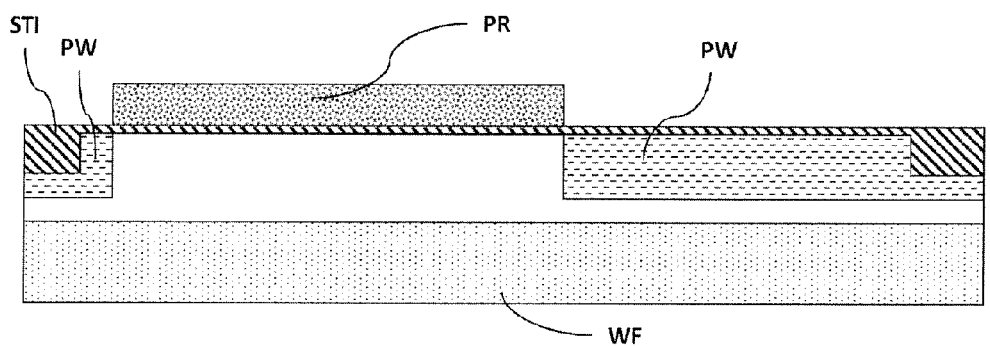

The P-type insulating wells designated PW for P-Well in FIG. 14c, and of N-type usually designated N-Well (not visible in FIG. 14c) for conventional transistors are produced in accordance with standard CMOS procedure for example by implantation and masking using a mask PR as illustrated in FIG. 14c.

Figure 14D:
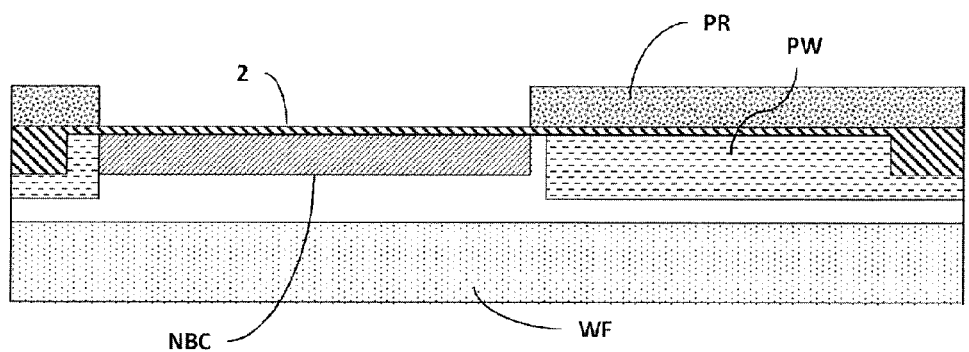

The following step is the implanting of the well NBC by N-doping in the substrate as illustrated in FIG. 14d. For example this may be As implantation at 70 keV and a dose of $2 \times 10^{12}$ cm$^{-2}$.

Figure 14E:
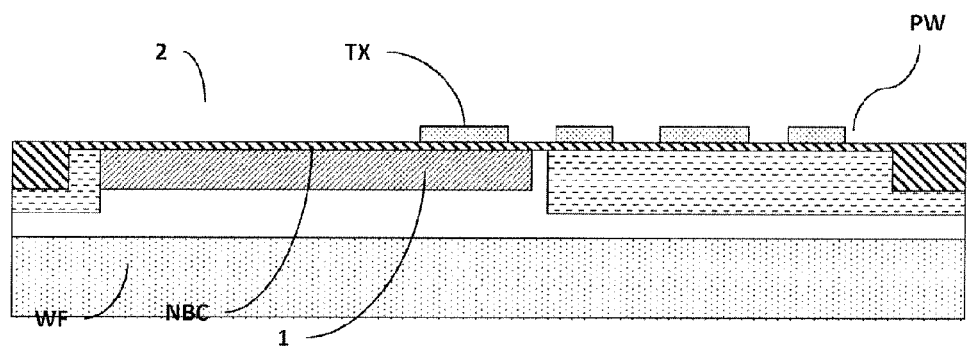
Figure 14F:
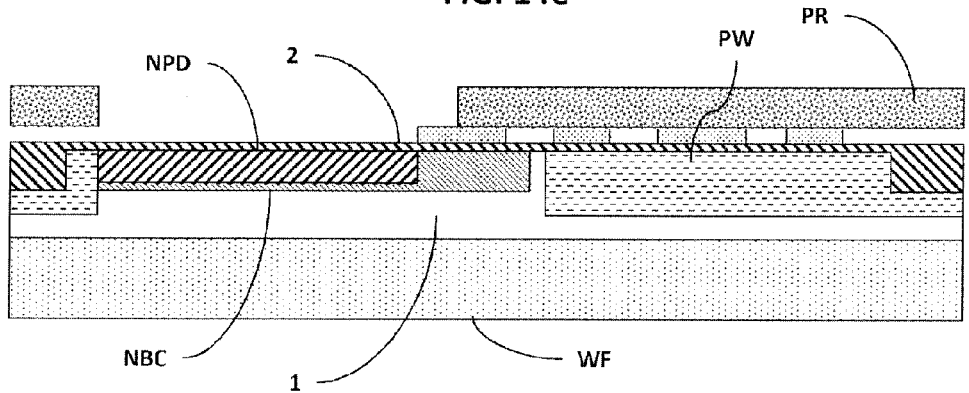

The MOS transistor gates are then formed in polysilicon on the surface electrically insulated from the substrate as illustrated in FIG. 14e.

Next, the photoelectric conversion zone NPD is formed by N-doping in the substrate so that the well NBC covers the extent of the photoelectric conversion zone NPD. The N-doping of the photoelectric conversion zone NPD is heavier than the N-doping of the well. For example this may be As implantation at 70 Kev and at a dose of $4.5 \times 10^{12} \times$ cm$^{-2}$. This step corresponds to FIG. 14f.

Figure 14G:
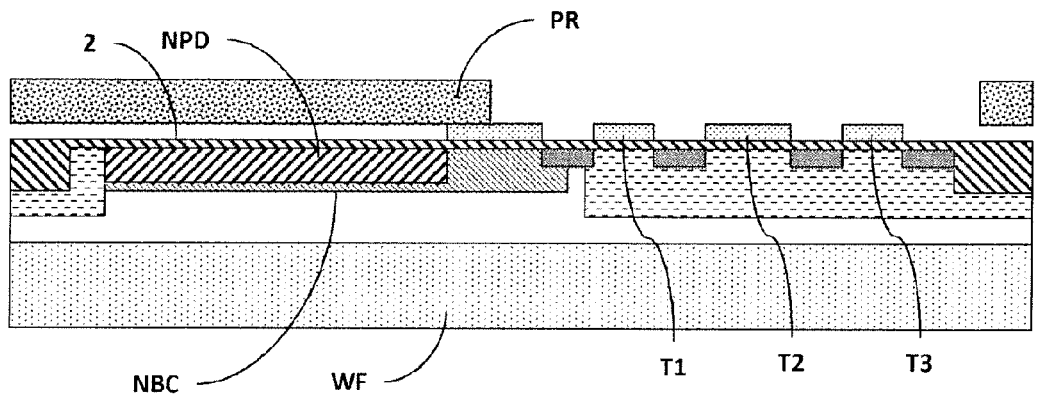

The drains and sources of MOS transistors in the substrate are then formed as illustrated in FIG. 14g followed by forming of the floating diffusion node(s) FD.

Figure 14H:
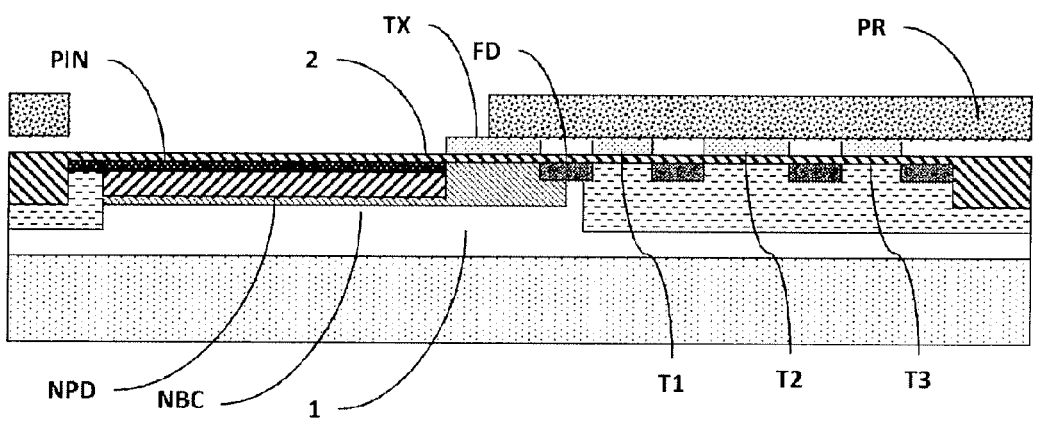

The heavily P-doped surface zone PIN is then formed at the photoelectric conversion zone NPD as illustrated in FIG. 14h. Any memory regions as in FIG. 12a are also covered by a heavily P-doped surface zone PIN. The surface zone PIN is formed at the end of the process to limit diffusion thereof by heat treatment and to obtain a thin zone. The implanting of the surface zone PIN must be very much on the surface and at high dose. It is possible for example to use $BF_2$ ions at 10 keV at a dose of $2 \times 10^{13} \times cm^{-2}$.

Figure 14I:
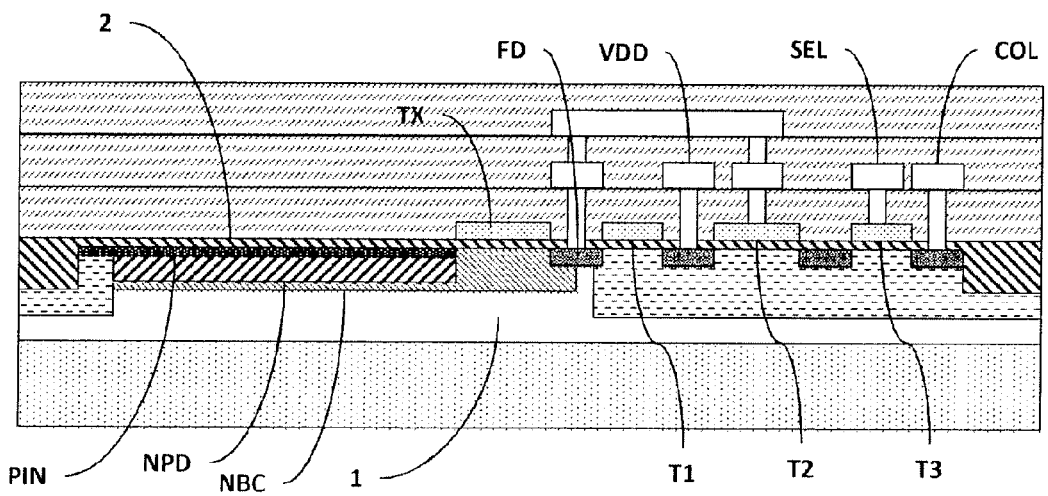

Finally, known fabrication steps for this type of structure i.e. interconnection via metallisation, the forming of connection pads and passivation, lead to the active pixel structure in FIG. 14i.

This method of fabrication is indicative and can be adapted by those skilled in the art. The doping doses can be calculated in relation to each design as a function of pixel size and as a function of biasing voltages. Some steps are known in that they belong to any CMOS fabrication method whilst other steps are specifically applied in the invention. In particular the implanting of the well NBC, of the surface zone PIN and of the photoelectric conversion zone NPD are specific to the invention and require a mask for implantation of the well NBC and another for implanting the surface zone PIN and the photoelectric conversion zone NPD.

By applying the values given as examples a structure is obtained offering a maximum potential of 1 V in the photoelectric conversion zone NPD on full depletion and a minimum potential of 0.5 V underneath the gate of the transfer transistor TX. The biasing voltage of the gate of the transfer transistor TX is between −0.5 V (low potential for integration) and 4V (high potential for transfer). These values are solely indicative. The document titled <<Estimates for Scaling of Pinned Photodiodes>> presented by Alex Krymski and Konstantin Feklistov in <<2005 IEEE Workshop on Charge-Coupled Devices and Advanced Image Sensors>> gives a practical method for evaluating doses and energy levels for implanting the well NBC, the photoelectric conversion zone NPD and the surface zone PIN.

The reset transistor T1 may be a conventional NMOS transistor. It is preferable to choose a reset transistor T1 with low threshold voltage to maintain the voltage on the floating diffusion node FD after deactivation of this transistor.

A second embodiment will now be described. This second embodiment may reproduce numerous technical characteristics set forth in the first embodiment and only the differences between the two embodiments will be described below. In this second embodiment, the forming of the photoelectric conversion zone NPD and the at least partial forming of the surface zone PIN forming a passivation layer are carried out before fabricating the CMOS transistors.

Therefore whereas in the first embodiment the photodiode junctions can only be formed by the same heat treatment as the CMOS transistors, the second embodiment allows the separate forming of the photodiode and of the transfer transistor. This provides much greater flexibility in the design of the fabrication process but also better photoelectric quality of the photodiode.

In addition, the implanting of the doped zones forming the photodiode PPD generally damages the crystalline structure of the substrate in which implanting is carried out. Thermal annealing of long duration e.g. several minutes to correct this damage then becomes possible before forming the CMOS transistors.

With this second embodiment it is possible to place the main forming of the photodiode PPD before the fabrication steps of the CMOS transistors, and thereby achieve considerable relaxation of heat budget constraints between the needs of the photodiode and those of the CMOS transistors.

Figure 15A:
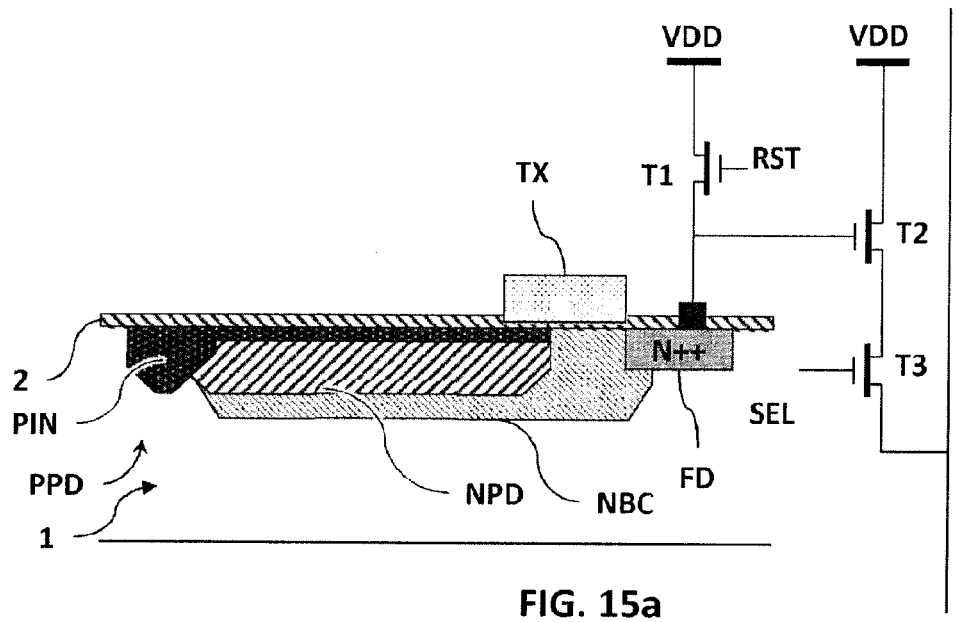
FIGS. 15a and 15b are schematics giving cross-sectional views of pixel structures according to a second embodiment.
Figure 15B:
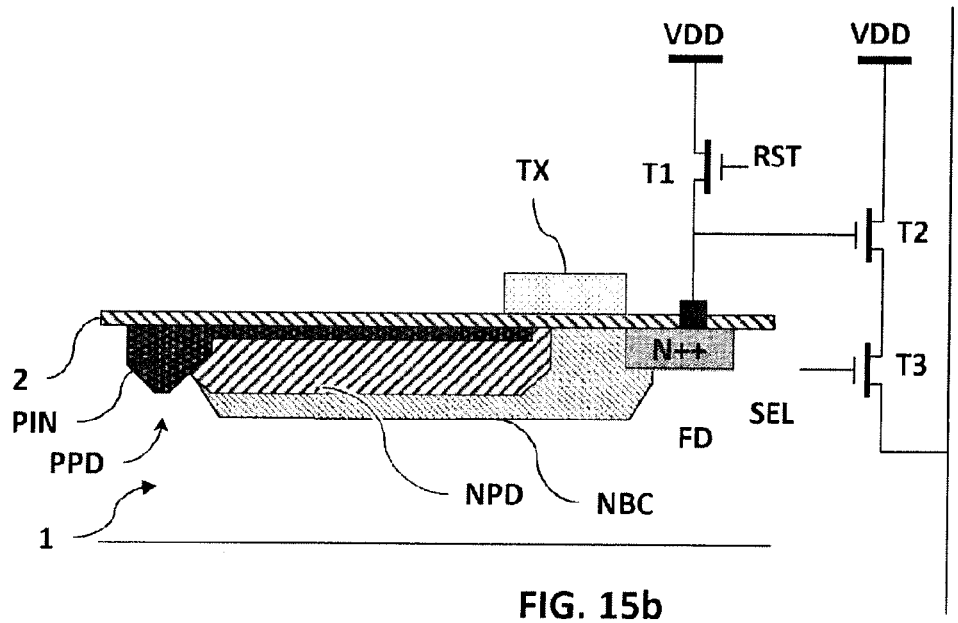

FIGS. 15a and 15b illustrate examples of a pixel structure according to the second embodiment.

As in the first embodiment, the active pixel structure of CMOS type comprises:
a P-type semiconductor substrate;
at least one photoelectric conversion zone NPD defined by N-doping in the substrate, accumulating an amount of charge during exposure to light and comprising a P-doped surface zone PIN;
at least one floating diffusion node FD defined by N-doping in the substrate;
at least one readout circuit to read a variation in voltage on the floating diffusion node FD induced by the transferred charges;
at least one transfer transistor TX of MOS type, the gate of said transfer transistor TX being electrically insulated from the substrate and being controllable to transfer said charges from said photoelectric conversion zone NPD to said floating diffusion node FD.

This second embodiment is characterized by overlapping between the gate of the transfer transistor TX and the photodiode PPD formed by the photoelectric conversion zone NPD and the P-doped surface zone PIN.

Therefore the gate of the transfer transistor TX partly covers said P-doped surface zone PIN, and the photoelectric conversion zone NPD extends underneath said gate of said transfer transistor TX at least as far as the end of the P-doped surface zone PIN covered by said gate of the transfer transistor TX.

Preferably the P-doped surface zone PIN extends under the gate of said transfer transistor TX as far as the end of said photoelectric conversion zone NPD on the side of said gate of the transfer transistor TX.

Also preferably, the P-doped surface zone PIN extends under the gate of said transfer transistor TX and leaves free part of the surface of said photoelectric conversion zone NPD on the side of said gate of the transfer transistor TX.

As previously explained, it is possible to associate with the structure of this second embodiment the technical characteristics that are set forth above in the description of the first embodiment.

For example it is possible to provide a well NBC defined by N-doping in the substrate, the well NBC being in contact with the floating diffusion node FD and with the photoelectric conversion zone NPD and covering at least part of the extent of said photoelectric conversion zone NPD to ensure transfer of charges in the bulk of the well NBC. The structures shown in FIGS. 15a and 15b illustrate a said well NBC. The well NBC preferably covers the entire extent of said photoelectric conversion zone NPD.

In this case and preferably the N-doping of the well NBC and the N-doping of the photoelectric conversion zone NPD are lighter than the N-doping of the floating diffusion node FD, and the N-doping of the well NBC is lighter than the N-doping of the photoelectric conversion zone NPD.

Also preferably the electric potential profiles of the photoelectric conversion zone NPD and of the well NBC at the transfer transistor TX exhibit electric potential peaks at the same depth of the substrate.

Similarly it is also possible to provide the structure with at least one memory region in the well NBC between the photoelectric conversion zone NPD and the floating diffusion node FD, which can be defined by N-doping (NMEM) in the well NBC with a P-doped surface zone between two transfer transistors TX1, TX2 as in FIG. 12a. Preferably the N-doping of the memory region is heavier than the N-doping of the photoelectric conversion zone NPD and lighter than the N-doping of the floating diffusion node FD.

Figure 16A:
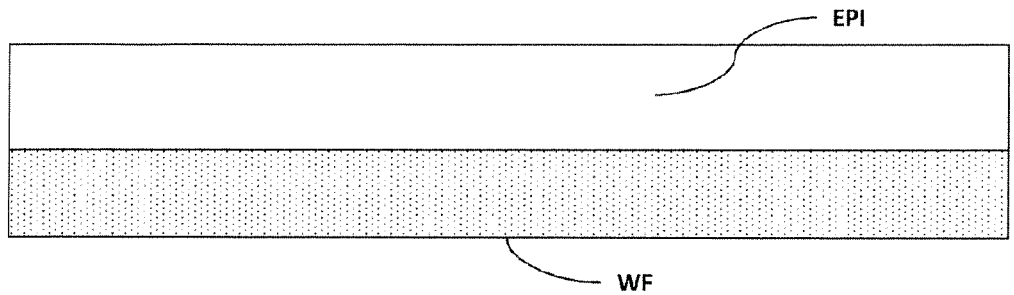
FIGS. 16a to 16j illustrate different steps of a second method for fabricating an active pixel structure.
Figure 16B:
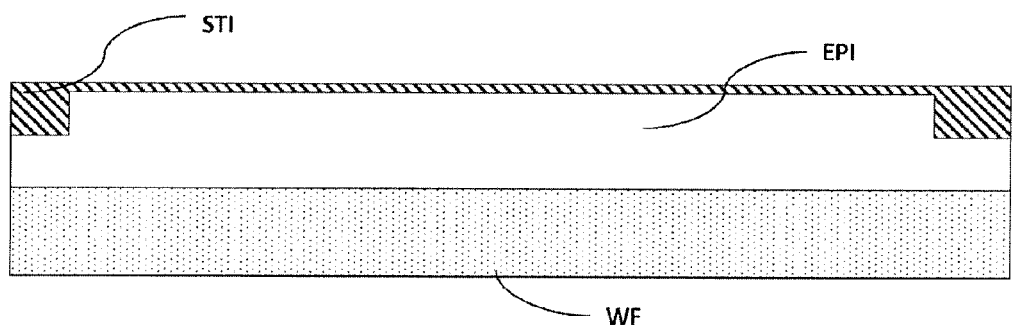
Figure 16C:
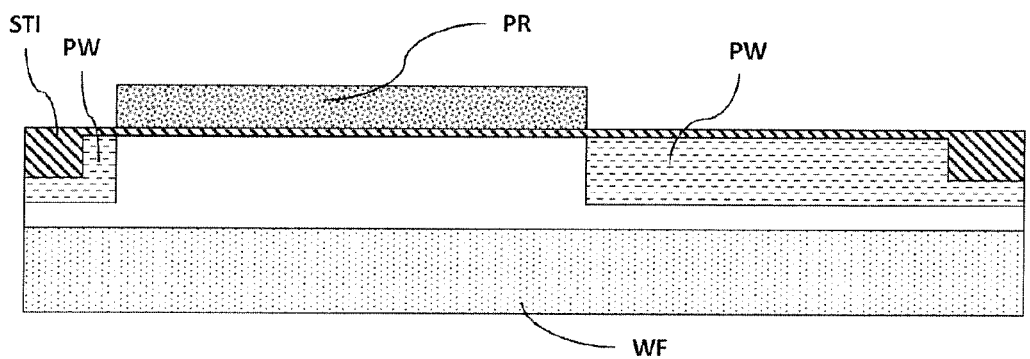
Figure 16D:
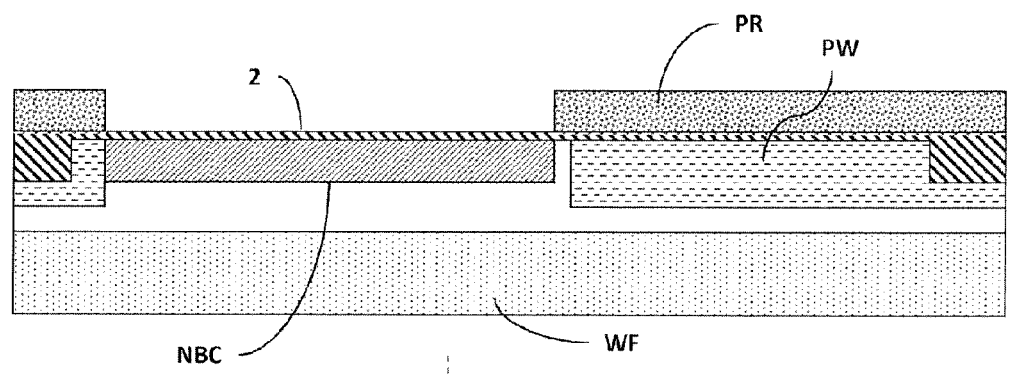
Figure 16E:
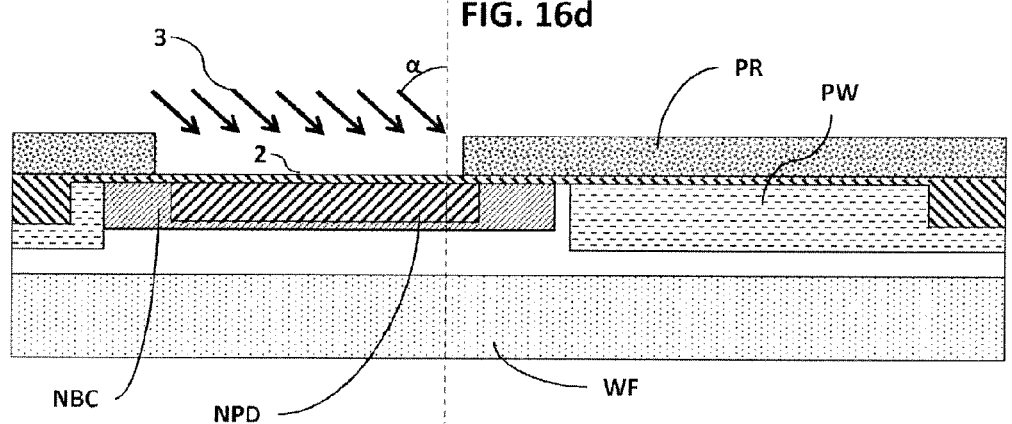
Figure 16F:
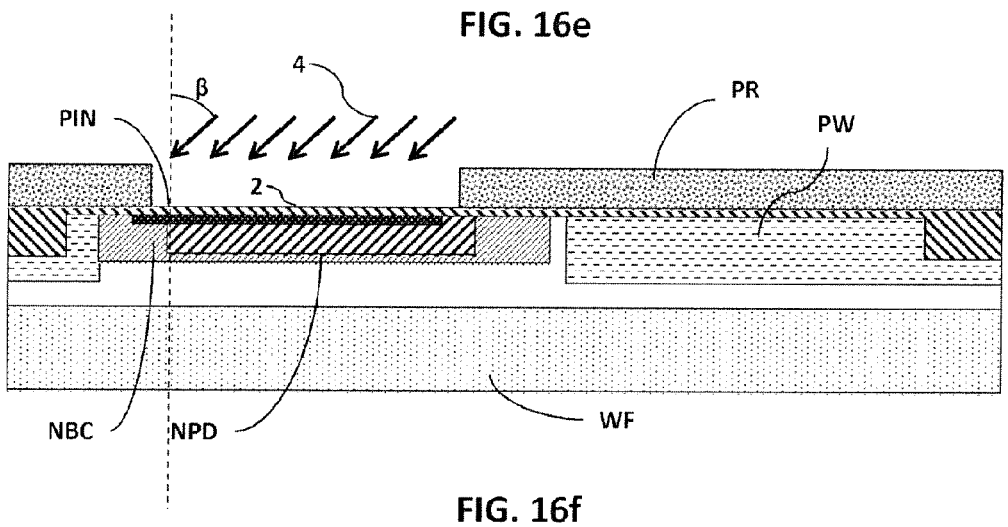
Figure 16G:
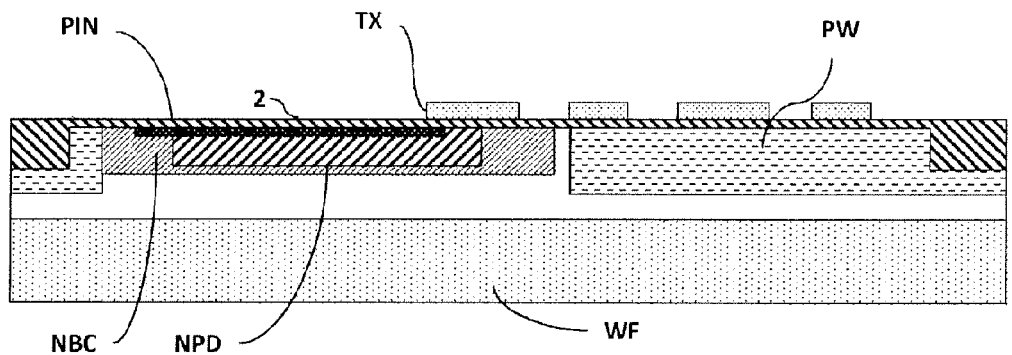
Figure 16H:
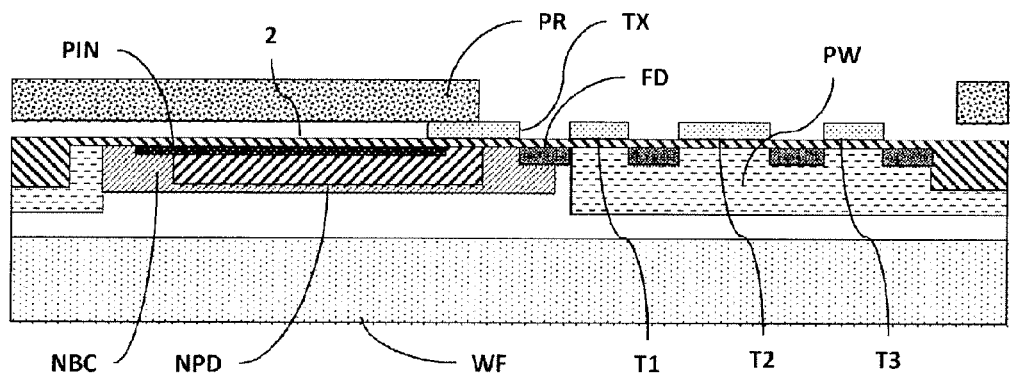
Figure 16I:
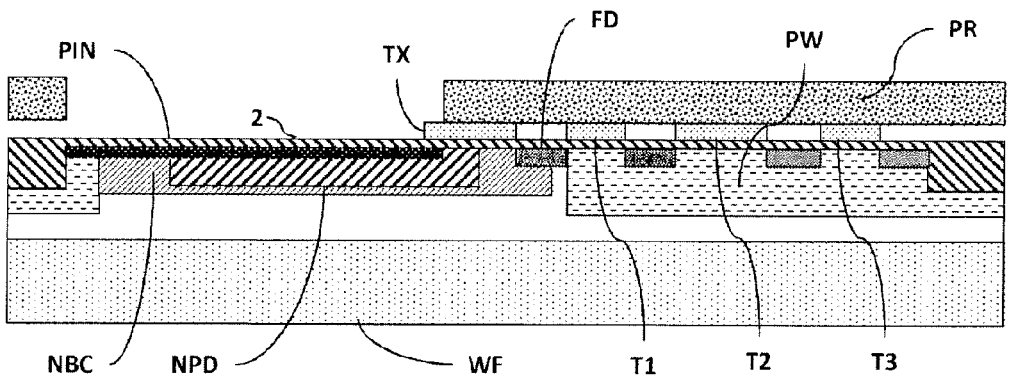
Figure 16J:
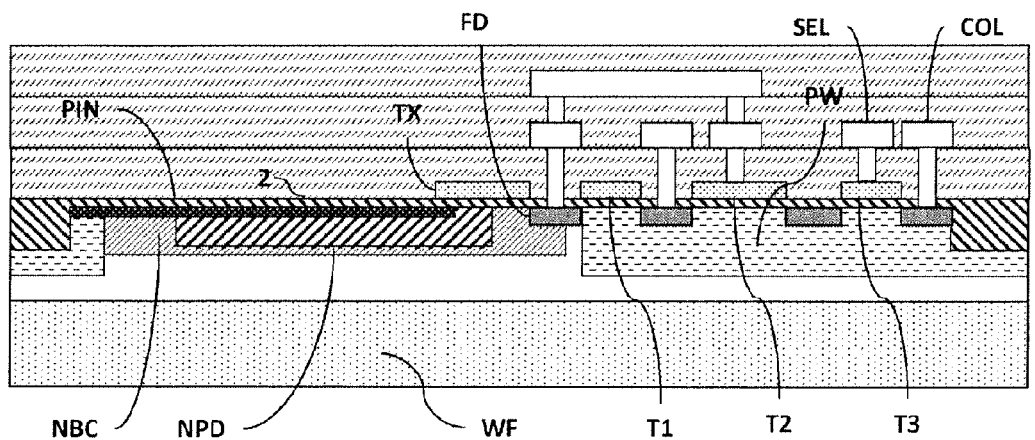

FIGS. 16a and 16j illustrate different steps of a method for fabricating an active pixel structure according to the second embodiment of the invention. This method reproduces most of the steps of the method for fabricating an active pixel structure according to the first pixel structure embodiment with the notable exception that the selective doping used to form the photoelectric conversion zone NPD and the selective doping used to form the P-doped surface zone PIN are conducted before forming the gate of the transfer transistor TX.

Therefore starting from an initial situation corresponding to FIG. 16a in which a P-type silicon wafer WF carries a P-type epitaxied layer EPI, said epitaxied layer EPI having a thickness of between 3 and 10 μm for example in relation to pixel size and the desired spectral response. The electric resistivity of the wafer WF is lower than that of the epitaxied layer EPI. For example, the electric resistivity of the wafer WF is 0.01 Ω·cm whilst that of the epitaxied layer EPI is between 8 and 20 Ω·cm.

The isolating islands are then formed in the form of lateral isolating structures via shallow trenches (Shallow Trench Isolation—STI) conforming to a standard CMOS method as illustrated in FIG. 16b. This isolation is also used for electrical insulation of the components arranged on the surface of the substrate vis-à-vis this substrate and in particular the gate(s) of the transfer transistors TX.

The P-type isolating wells designated PW for P-Well in FIG. 16c, and of N-type usually called N-Well (not visible in FIG. 16c) for conventional transistors are produced using a standard CMOS method for example by implanting and masking using a mask PR as illustrated in FIG. 16c.

The forming of the well NBC is optional but is part of the preferred embodiment. The following step in this case is the forming of the well NBC by N-doping in the substrate as illustrated in FIG. 16d. For example this may be As implanting at 70 keV and at a dose of $2 \times 10^{12} \times cm^{-2}$.

The photoelectric conversion zone NPD is then defined by N-doping in the substrate followed by forming of a P-doped surface zone PIN at said photoelectric conversion zone NPD.

For example the photoelectric conversion zone NPD is formed by selective N-doping in the substrate so that the well NBC, if one has been formed, covers the extent of the photoelectric conversion zone NPD. The N-doping of the photoelectric conversion zone NPD is heavier than the N-doping of the well NBC. For example this may be As implantation at 70 Kev and at a dose of $4.5 \times 10^{12} \times cm^{-2}$. It is also possible to use phosphorus ions. The implanting energy is chosen so that the photoelectric conversion zone NPD lies mostly at depth. This step corresponds to FIG. 16e.

The heavily P-doped surface zone PIN is then formed at the photoelectric conversion zone NPD as illustrated in FIG. 16f. Any memory regions as in FIG. 12a are also covered by a heavily P-doped surface zone PIN. The implanting of the surface zone PIN must be very much on the surface and at a high dose. For example $BF_2$ ions can be used at 10 keV and at a dose of $2 \times 10^{13} \times cm^{-2}$. Provision can be made to form the surface zone PIN only in part and to complete the formation thereof at the end of the process after thermal annealing to limit too extensive diffusion by the heat treatment and to obtain a thin zone.

It is advantageously possible to use the same fabrication mask successively to form the photoelectric conversion zone NPD and the heavily P-doped surface zone PIN. Advantageously a dual-implanting step is carried out.

The prior forming of the surface zone PIN before forming the gate of the transfer transistor TX allows overlapping between the photodiode and said gate of the transfer transistor TX without creating problems of alignment which may generate barriers or retaining pockets during the transfer of charges via this transfer transistor. The P-doped surface zone PIN forms a shield against the electric effect of the gate of the transfer transistor TX on that part covered by the photodiode. Therefore the transfer transistor maintains satisfactory functioning despite the overlapping of the photodiode and the gate of the transfer transistor TX.

The P-doped surface zones PIN and the photoelectric conversion zone NPD can be perfectly aligned to prevent the onset of an energy pocket. Therefore, after the step to form the photoelectric conversion zone NPD and the P-doped surface zone PIN, the P-doped surface zone extends as far as the end of the photoelectric conversion zone NPD on the side intended to receive the gate of the transfer transistor TX.

It is also to make provision so that the P-doped surface zone leaves free part of the surface of said photoelectric conversion zone NPD on the side intended to receive the gate of the transfer transistor TX and subsequently the gate of the transfer transistor TX covers the surface left free of said photoelectric conversion zone NPD.

To offset doping using the same mask the respective angles of incidence α, β of the respective implantation directions 3, 4 in the substrate of the photoelectric conversion zone NPD and of the P-doped surface zone PIN, in relation to the normal to the surface of the substrate, can differ from one another as illustrated in FIGS. 16e and 16f respectively, so that the P-doped surface zone PIN leaves free part of the surface of the photoelectric conversion zone NPD on the side intended to receive the gate of the transfer transistor TX. The respective angles of incidence α, β of the implanting directions 3, 4 in the substrate of the photoelectric conversion zone NPD and P-doped surface zone PIN may also be of opposite signs.

A first heat treatment of the photodiode is then carried out, before forming the transistors. This operation may be rapid (RTA) or longer depending on the desired doping profiles. Long annealing homogenises the concentration of dopants in the doped regions of the photodiode so that it is then possible to improve the quality of the photodiode as compared with a heat budget restricted because of the presence of the transistors. The first heat treatment corresponds to a first heat budget which may be higher than heat treatment conventionally used to activate the dopants of CMOS transistors.

The gates of the MOS transistors are then formed in polysilicon on the surface electrically insulated from the substrate as in FIG. 16g. The gate of the transfer transistor TX of MOS type covers the surface left free in the photoelectric conversion zone NPD and partly covers said P-doped surface zone PIN.

At least one floating diffusion node FD is formed by N-doping in the substrate and extends as far as the gate of the transfer transistor TX.

The drains and sources of the MOS transistors in the substrate are then formed as illustrated in FIG. 16h.

Additional implantation with P-doping is then performed as in FIG. 16i to extend said P-doped surface zone PIN as far as the P-doped isolating well PW implanted in the substrate. Second heat treatment typically of RTA type is then conducted as conventionally applied when forming transistors. This second heat treatment corresponds to a second heat budget distinct from the first heat budget.

The independence of the respective heat treatments related to the photodiodes and transistors and their associated heat budgets provides great flexibility in the conducting of these heat treatments and hence in the fabrication of the photodiode array.

Finally the known fabrication steps of said structure i.e. interconnection via metallisation, the forming of connection pads and passivation lead to the active pixel structure in FIG. 16*j*.

This fabrication method is indicative and can be adapted by persons skilled in the art. The doping doses can be calculated in relation to each design as a function of pixel size and as a function of biasing voltages. Some steps are known in that they belong to any CMOS fabrication method, whilst other steps are specific to the invention.

The invention claimed is:

1. An active pixel structure of CMOS type comprising:
   a P-type semiconductor substrate;
   at least one photoelectric conversion zone defined by N-doping in the substrate, accumulating an amount of charge during exposure to light and comprising a P-doped surface zone;
   at least one floating diffusion node defined by N-doping in the substrate;
   at least one readout circuit to read a variation in voltage on the floating diffusion node induced by the transferred charges;
   at least one transfer transistor of MOS type, the gate of said transfer transistor being electrically insulated from the substrate and controllable to transfer said charges from said photoelectric conversion zone to said floating diffusion node;
   wherein:
   the gate of said transfer transistor partly covers said P-doped surface zone; and
   said photoelectric conversion zone extends under said gate of said transfer transistor at least as far as the end of the P-doped surface zone covered by said gate of the transfer transistor, and
   wherein the structure comprises a well defined by N-doping in the substrate, the well being in contact with the floating diffusion node and with the photoelectric conversion zone and covering at least part of the extent of said photoelectric conversion zone to ensure transfer of charges in the bulk of the well.

2. The structure according to claim 1, wherein said P-doped surface zone extends under the gate of said transfer transistor as far as the end of said photoelectric conversion zone on the side of said gate of the transfer transistor.

3. The structure according to claim 1, wherein said P-doped surface zone extending under the gate of said transfer transistor leaves free part of the surface of said photoelectric conversion zone on the side of said gate of the transfer transistor.

4. The structure according to claim 1, wherein the N-doping of the well and the N-doping of the photoelectric conversion zone are lighter than the N-doping of the floating diffusion node, and the N-doping of the well is lighter than the N-doping of the photoelectric conversion zone.

5. The structure according to claim 1, wherein the electric potential profiles of the photoelectric conversion zone and of the well at the transfer transistor exhibit electric potential peaks at the same depth of substrate.

6. The structure according to claim 1, wherein the well covers the entire extent of said photoelectric conversion zone.

7. The structure according to claim 1, further comprising at least one memory region in the well between the photoelectric conversion zone and the floating diffusion node.

8. The structure according to claim 7, wherein an optical mask masks said at least one memory region.

9. The structure according to claim 7, wherein at least one memory region is defined by N-doping in the well with a P-doped surface zone between two transfer transistors.

10. The structure according to claim 9, wherein the N-doping of the memory region is heavier than the N-doping of the photoelectric conversion zone and lighter than the N-doping of the floating diffusion node.

11. The structure according to claim 7, wherein at least one memory region is controlled by a gate of a MOS transistor.

12. An image sensor comprising an organized assembly of active pixel structures of CMOS type according to claim 1.

13. A method for fabricating an active pixel structure of CMOS type according to claim 1, wherein said method comprises at least the following steps:
   a) implanting P-type isolating wells in the substrate;
   b) forming a photoelectric conversion zone defined by N-doping in the substrate, and forming a P-doped surface zone at said photoelectric conversion zone;
   c) forming the gate of at least one transfer transistor of MOS type partly covering said P-doped surface zone;
   d) forming a floating diffusion node defined by N-doping in the substrate, extending as far as the gate of said MOS-type transfer transistor,
   wherein after step a) and before step b) a well defined by N-doping in the substrate is implanted so that the floating diffusion node formed at step d) is in contact with said well.

14. The fabrication method according to claim 13, wherein after step b) the P-doped surface zone extends as far as the end of the photoelectric conversion zone on the side intended to receive the gate of the transfer transistor.

15. The fabrication method according to claim 13, wherein after step b) the P-doped surface zone leaves free part of the surface of said photoelectric conversion zone on the side intended to receive the gate of the transfer transistor, and after step e) the gate of said transfer transistor covers the surface left free of said photoelectric conversion zone.

16. The method for fabricating an active pixel structure of CMOS type according to claim 13, wherein at step b) the photoelectric conversion zone is at least partly formed in the well, the N-doping to form said photoelectric conversion zone being heavier than the N-doping forming the well.

17. The method for fabricating an active pixel structure of CMOS type according to claim 13, wherein after step b) and before step c) heat treatment is carried out.

18. The method for fabricating an active pixel structure of CMOS type according to claim 13, wherein after step d) an additional P-doping operation is performed to extend said P-doped surface zone as far as the P-type isolating well implanted in the substrate.

19. The method for fabricating an active pixel structure of CMOS type according to claim 13, wherein the respective angles of incidence of the implanting directions in the substrate of said P-doped surface zone and said photoelectric conversion zone, in relation to the normal to the surface of said substrate, differ from one another so that the P-doped surface zone leaves free part of the surface of said photoelectric conversion zone on the side intended to receive the gate of the transfer transistor.

20. The method for fabricating an active pixel structure of CMOS type according to claim 19, wherein the respective angles of incidence of the implanting directions in the substrate of the P-doped surface zone and the photoelectric conversion zone have differing signs in relation to the normal to the surface of said substrate.

\* \* \* \* \*